United States Patent
O'Neill

(10) Patent No.: US 10,718,873 B2
(45) Date of Patent: Jul. 21, 2020

(54) ELECTROMAGNETIC RADIATION DETECTION DEVICE

(71) Applicant: Pixquanta Limited, Blackrock (IE)

(72) Inventor: Kevin O'Neill, Blackrock (IE)

(73) Assignee: Pixquanta Limited, Blackrock (IE)

(*) Notice: Subject to any disclaimer, the term of this patent is extended or adjusted under 35 U.S.C. 154(b) by 0 days.

(21) Appl. No.: 16/245,826

(22) Filed: Jan. 11, 2019

(65) Prior Publication Data
US 2019/0146100 A1 May 16, 2019

Related U.S. Application Data

(63) Continuation-in-part of application No. PCT/EP2018/055039, filed on Mar. 1, 2018.

(30) Foreign Application Priority Data

Mar. 16, 2017 (GB) .................................. 1704203.7

(51) Int. Cl.
*G01T 1/20* (2006.01)
*H01L 27/146* (2006.01)
(Continued)

(52) U.S. Cl.
CPC ............ *G01T 1/2018* (2013.01); *G01T 1/208* (2013.01); *G01T 1/248* (2013.01);
(Continued)

(58) Field of Classification Search
CPC ....... G01T 1/2018; G01T 1/208; G01T 1/248; H01L 24/1446; H01L 24/14603;
(Continued)

(56) References Cited

U.S. PATENT DOCUMENTS 7,323,692 B2    1/2008   Rowlands et al.
10,451,748 B1*  10/2019  Qiang ................... G01T 1/2018
(Continued)

FOREIGN PATENT DOCUMENTS

WO   2013018006 A1   2/2013
WO   2017004663 A1   1/2017
(Continued)

OTHER PUBLICATIONS

Beck, Patricia, et al., "High Current Density in uc-Si PECVD Diodes for Low Temperature Applications," MRS Spring Proceedings, 2004, San Francisco, California, 7 pages.
(Continued)

*Primary Examiner* — Mark R Gaworecki
(74) *Attorney, Agent, or Firm* — Withrow & Terranova, P.L.L.C.

(57) ABSTRACT

An electromagnetic radiation detection device comprises a matrix having a plurality of N rows divided into a plurality of M columns of cells, each cell comprising a plurality of diode segments responsive to electromagnetic radiation incident on said device. A scan driver provides a plurality of N scan line signals to respective rows of said matrix, each for enabling charge values from cells of a selected row of said matrix to be read. A reader reads a plurality of M variable charge value signals from respective columns of said matrix, each corresponding to a cell within a selected row of said matrix. Each diode segment is connected to a drive voltage sufficient to operate each diode segment in avalanche multiplication Geiger mode; and connected in series with an avalanche quenching resistor to said reader.

26 Claims, 18 Drawing Sheets

(51) Int. Cl.
*H01L 31/107* (2006.01)
*G01T 1/24* (2006.01)
*H01L 31/0248* (2006.01)
*G01T 1/208* (2006.01)
*H01L 31/0368* (2006.01)
*H01L 31/0376* (2006.01)
*H01L 31/0352* (2006.01)
*H01L 27/144* (2006.01)
*H01L 27/30* (2006.01)
*H01L 31/0392* (2006.01)

(52) U.S. Cl.
CPC .... *H01L 27/1446* (2013.01); *H01L 27/14603* (2013.01); *H01L 27/14612* (2013.01); *H01L 27/14663* (2013.01); *H01L 31/03529* (2013.01); *H01L 31/03682* (2013.01); *H01L 31/03762* (2013.01); *H01L 31/107* (2013.01); *H01L 27/14659* (2013.01); *H01L 27/308* (2013.01); *H01L 31/03921* (2013.01); *Y02E 10/546* (2013.01); *Y02E 10/548* (2013.01)

(58) Field of Classification Search
CPC ......... H01L 24/14612; H01L 24/14659; H01L 24/14663; H01L 24/308; H01L 31/03529; H01L 31/03682; H01L 31/03762; H01L 31/03921; H01L 31/107; Y02E 10/546; Y02E 10/548
See application file for complete search history.

(56) References Cited

U.S. PATENT DOCUMENTS

| | | | |
|---|---|---|---|
| 2006/0202129 A1 | 9/2006 | Niclass et al. | |
| 2009/0095887 A1* | 4/2009 | Saveliev | H01L 27/14601 250/214 R |
| 2010/0108900 A1 | 5/2010 | Burr et al. | |
| 2010/0245809 A1* | 9/2010 | Andreou | H01L 27/14603 356/222 |
| 2013/0009266 A1 | 1/2013 | Sato et al. | |
| 2013/0153975 A1* | 6/2013 | Henseler | H01L 27/14603 257/290 |
| 2014/0175294 A1* | 6/2014 | Frach | H04N 5/369 250/363.03 |
| 2014/0319638 A1* | 10/2014 | Chia | H01L 31/107 257/438 |
| 2015/0115131 A1 | 4/2015 | Webster et al. | |
| 2015/0285625 A1* | 10/2015 | Deane | G01S 7/4816 348/140 |
| 2016/0300973 A1* | 10/2016 | Shen | H01L 31/18 |
| 2017/0131143 A1* | 5/2017 | Andreou | G01J 1/44 |
| 2017/0192090 A1* | 7/2017 | Roy | H01L 27/14612 |

FOREIGN PATENT DOCUMENTS

| | | |
|---|---|---|
| WO | 2018021411 A1 | 2/2018 |
| WO | 2018166805 A1 | 9/2018 |

OTHER PUBLICATIONS

Boer, Willem Den, "Active Matrix Liquid Crystal Displays," (book), 2005, Elsevier Inc., 252 pages.

Calleja, Cesar, et al., "Amorphous Silicon-Germanium Films with Embedded Nanochrystals for Thermal Detectors with Very High Sensitivity," Journal of Nanotechnology, Research Article, vol. 2016, Feb. 2016, Hindawi Publishing Corporation, 10 pages.

Gomes, R.B., et al., "GaAs/Al0.8Ga0.2As avalanche photodiodes for soft X-ray spectroscopy," Journal of Instrumentation, vol. 9, Issue 3, Mar. 25, 2014, IOP Publishing, 12 pages.

Hong, Jyh-Wong, et al., "The Hydrogenated Amorphous Silicon Reach-Through Avalanche Photodiodes (a-Si: H RAPD's)," Journal of Quantum Electronics, vol. 26, Issue 2, Feb. 1990, IEEE, pp. 280-284.

Jawed, Syed, et al., "A generic low-noise CMOS readout interface for 64 × 64 imaging array with on-chip ADC," Analog Integrated Circuits and Signals Processing, Aug. 2012, Springer Science+Business Media, LLC, pp. 273-289.

Perenzoni, Matteo, et al., "A 64 × 64-Pixels Digital Silicon Photomultiplier Direct TOF Sensor With 100-Mphotons/s/pixel Background Rejection and Imaging, Altimeter Mode With 0.14% Precision Up to 6 km for Spacecraft Navigation and Landing," Journal of Solid-State Circuits, vol. 52, Issue 1, Jan. 2017, IEEE, pp. 151-160.

Spuentrup, Jan, et al., "Thin Film on CMOS Active Pixel Sensor for Space Applications," Sensors, vol. 8, Oct. 2008, pp. 6340-6354.

Wyrsch, N., et al., "Thin-film silicon detectors for particle detection," Physica Status Solidi, vol. 1, Issue 5, Mar. 2004, Wiley-VCH, 8 pages.

Wyrsch, N., et al., "Vertical integration of hydrogenated amorphous silicon devices on CMOS circuits," MRS Spring Meeting, Symposium D, 2005, 12 pages.

Yan, Lujiiang, et al., "An amorphous silicon photodiode with 2THz gain-bandwidth product based on cycling excitation process," Applied Physics Letters, vol. 111, Issue 10, Sep. 2017, AIP Publishing, 5 pages.

Search and Examination Report for United Kingdom Patent Application No. GB1704203.7, dated Jul. 21, 2017, 7 pages.

International Search Report and Written Opinion for International Patent Application No. PCT/EP2020/050277 dated Apr. 3, 2020, 13 pages.

* cited by examiner

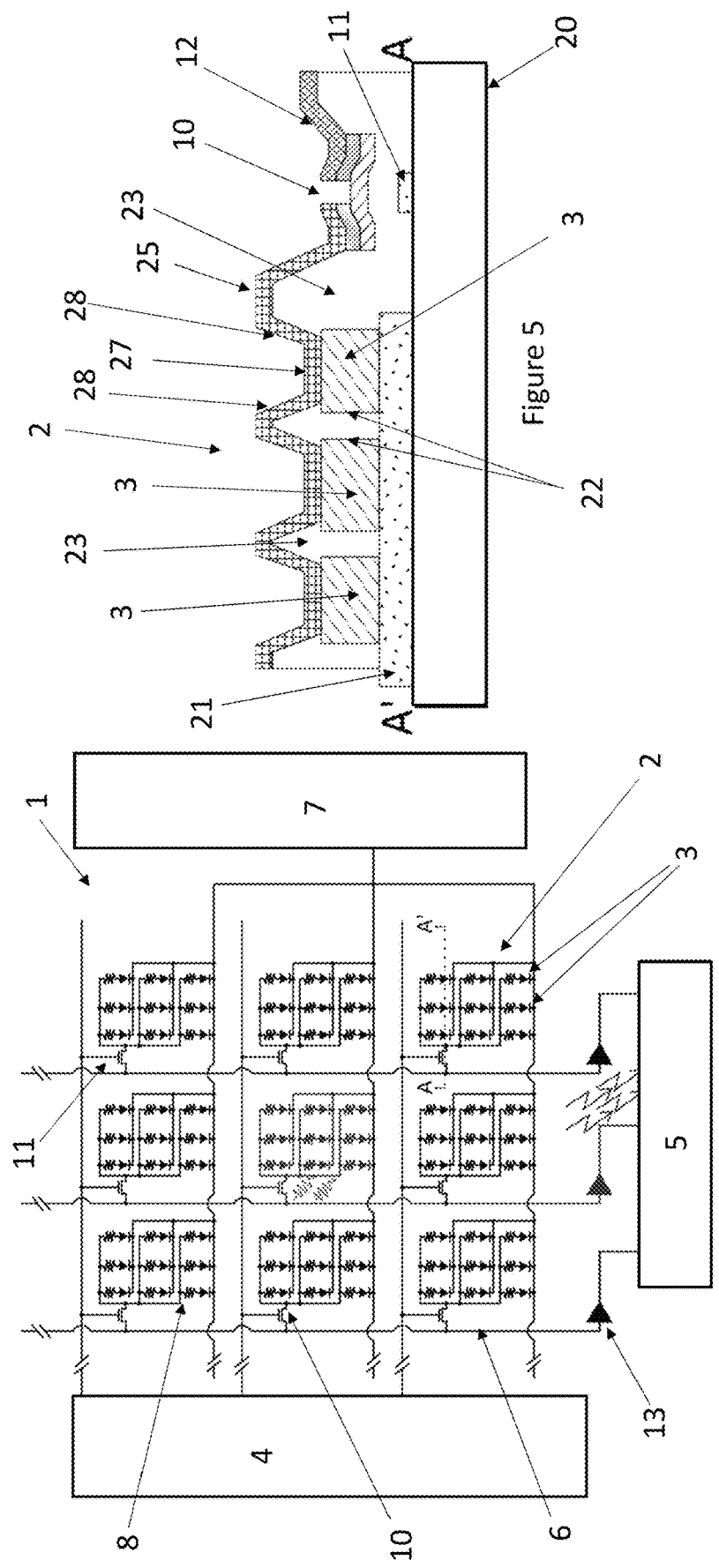

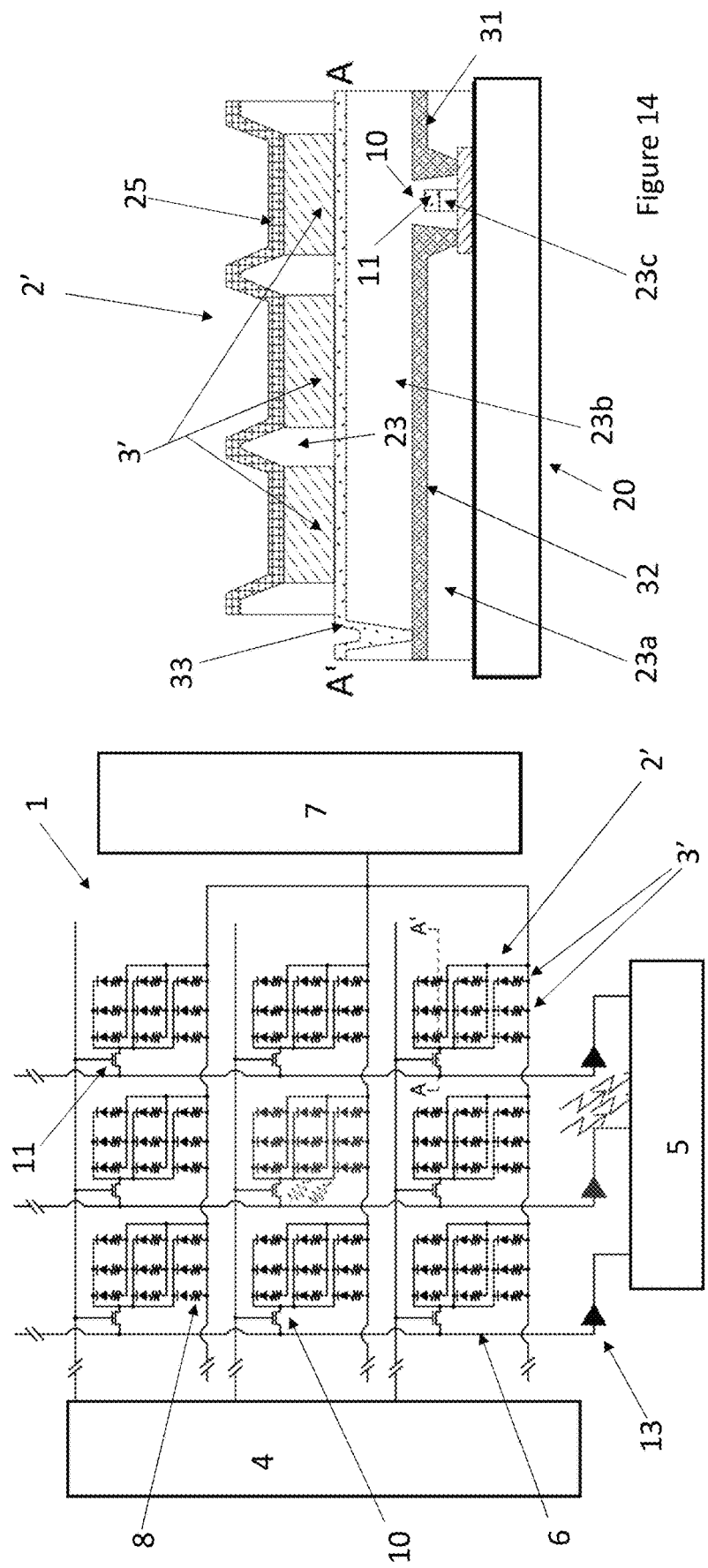

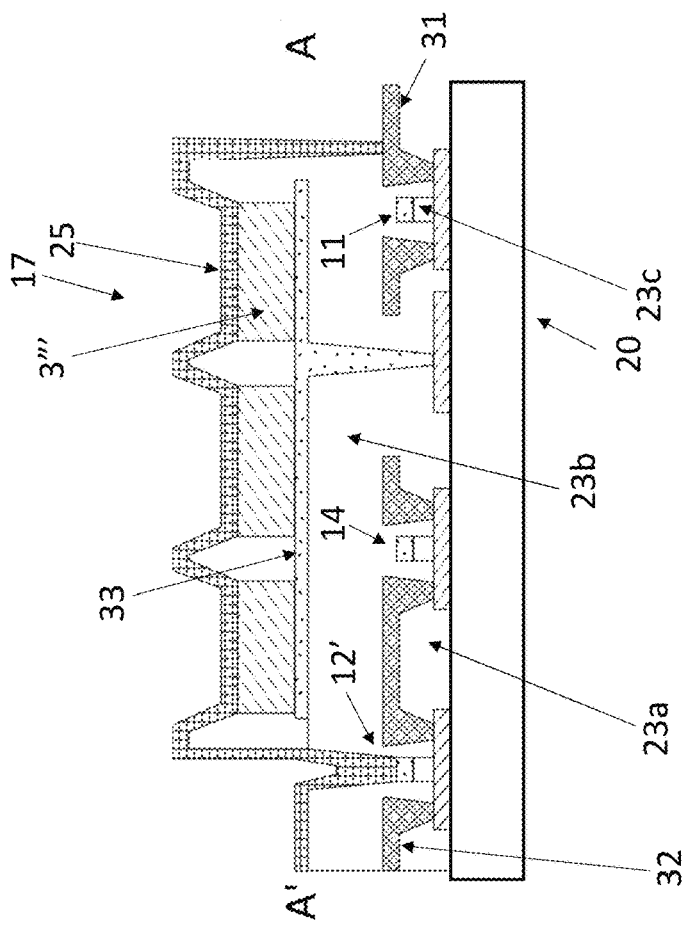
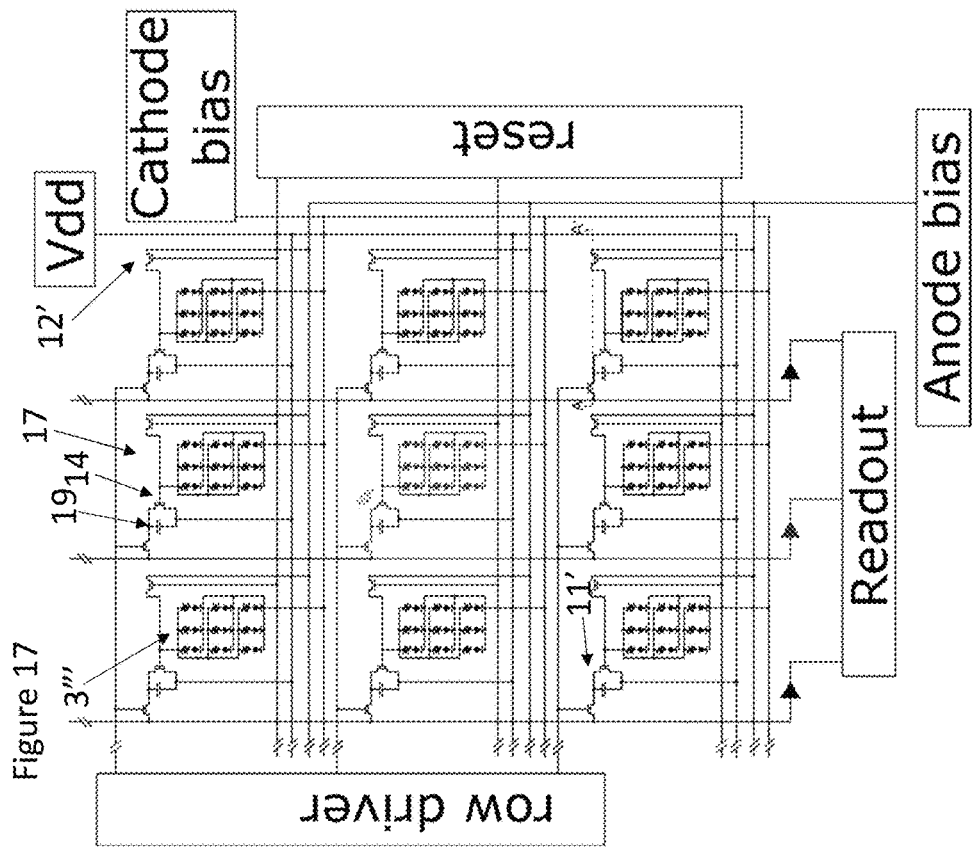
Figure 17
Figure 18

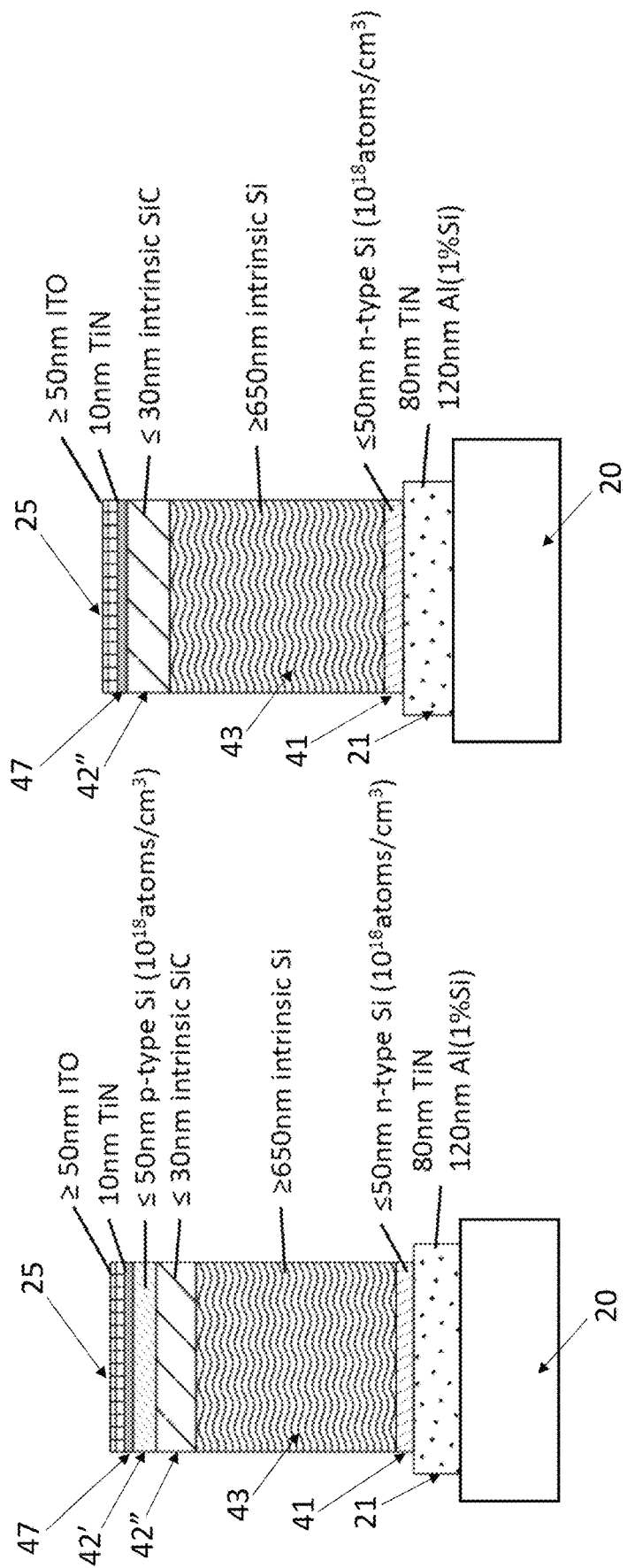

ELECTROMAGNETIC RADIATION DETECTION DEVICE

This application is a continuation-in-part of international patent application no. PCT/EP2018/055039, filed Mar. 1, 2018, which claims priority to United Kingdom patent application no. GB 1704203.7, filed Mar. 16, 2017, the disclosures of which are incorporated herein by reference in their entireties.

FIELD

The present invention relates to an electromagnetic radiation detection device.

BACKGROUND

In applications such as Digital Radiography (DR), Flat Panel Detectors (FPDs) can be used to indirectly acquire X-Ray images. FPDs typically comprise a matrix of individual pixel sensor circuits and use indirect conversion from X-ray photons to optical photons using a "phosphor" (not shown) over the entire area of the detector. Typical scintillation materials used in X-ray imaging are phosphors such as structured Cesium Iodide (CsI(TI)) and Gadolinium Oxy-Sulfide (Gd2O2S(Tb)), also known as GadOx or GOS. Optical light photons from the phosphor that reach photodiodes within respective pixel circuits are converted into single electron-hole pairs, and the resulting charge is stored within the pixel circuits, using either discrete capacitors and/or parasitic capacitance.

FIG. 1 shows a circuit diagram for a 3×3 pixels portion of a conventional amorphous silicon backplane silicon FPD which uses an Active Matrix (AM) sequential addressing scheme. FIG. 2 shows a cross-section of a first example of an individual pixel for the matrix portion shown in FIG. 1. FIG. 3 shows a cross-section of a second example of an individual pixel formed using a Silicon-on-Glass process. As shown in FIGS. 2 and 3, the individual pixel comprises a single detecting diode electrically connected to a corresponding thin-film switching transistor.

In operation, charge that is accumulated (in capacitors not shown) during an X-ray exposure of a pixel circuit is readout by sequentially addressing a row gate electrode, which turns the switching thin-film transistor of the pixel circuit from an off-state into an on-state. The resulting charge, which is proportional to the X-ray intensity at that pixel position, is then conducted to a respective readout circuit for a column.

U.S. Pat. No. 7,323,692, Rowlands and Zhao describes the use of an avalanche layer in X-Ray imaging indirect conversion detectors, using an active matrix addressing scheme. Here X-rays enter a phosphor such as Caesium Iodide (CsI), generate a shower of optical photons, which further generate electron-hole pairs via photoelectric effect in the avalanche layer, which may be amorphous Selenium or amorphous Silicon.

Nonetheless, these detectors are limited by Detection Quantum Efficiency (DQE) at low dose of incident electromagnetic radiations.

Thus, high-quality large-area X-ray images of high-risk category subjects, such as the pregnant, children, or the obese, require high dose levels to achieve a useful image. If the exposure risk is considered too high to proceed, an alternative, inferior, diagnostic method must be used.

Separately, in virtual reality applications, gesture recognition and eyeball tracking is currently achieved by imaging the body or the eyes under illumination, typically in the infra-red wavelength range. Nonetheless, near infra-red imaging sensors, especially for eyeball tracking, are limited by scene illumination intensity and speed limited by acquisition/integration time.

It is an object of the present invention to mitigate these shortcomings.

SUMMARY

According to the invention, there is provided an electromagnetic radiation detection device according to claim 1. The invention relies on avalanche multiplication Geiger mode breakdown in the diodes of the radiation detection device, to create a high charge pulse for every electromagnetic radiation quantum, or photon, converted to a signal. This means that several thousand electron charges can contribute to the signal generated by a single photon, which is different to the process in a conventional amorphous silicon diodes implementation, where conversion gain is below unity.

Each cell, or pixel, of the radiation detection device has a segmented structure, comprising a plurality of diode segments, to control the gain of the avalanche multiplication.

A resistor with high resistance is connected in series to each diode segment of the cells to prevent or quench runaway avalanche of the individual diode segments, once avalanche is initiated.

Thus, embodiments of this invention enable high-quality large-area X-ray imaging of subjects, such as high-risk category subjects, with lower, safer exposure doses. In some use cases, high frame-rate sequential imaging of subjects, for example, angiograms, can be made with lower dose and at higher frame-rates than the incumbent technology.

Alternatively, in use cases of the detection device where there is no need to limit an X-ray dose, the exposure time per frame can be reduced. This reduces the blurring of images due to patient movement during exposure, for example, due to blood flow or heartbeat, resulting in an improved image quality. Also, for hazard & threat applications, where cargo is dynamically scanned, shorter exposure times will result in less blurring due to reduced movement of the object during scanning.

Among the medical applications of the radiation detection device according to the invention are: CT imaging, PET imaging, SPECT imaging, and DR (Digital Radiography) imaging.

Other non-medical applications comprise: cargo scanning or detection at airports, or radiation detection (e.g. for nuclear physics experiments, non-destructive testing, or for large-area hazard and threat).

Among other imaging applications which can benefit from the use of this electromagnetic radiation detection device there are LiDAR imaging, VR retina camera, low light level contact image sensors (CIS), and security applications (e.g. for low light level cameras).

According to a second aspect there is provided a time-of-flight imaging device according to claim 14.

These devices find application where the goal is to capture an arrival time of a single photon with the photon generating a plurality of electrons within the diode, and improving the quality of detection of such devices.

Applications for embodiments of this aspect include ranging or triangulation applications.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

Embodiments of the invention will now be described, by way of example, with reference to the accompanying drawings, in which:

FIG. 4 shows a portion of an active matrix FPD according to an exemplary embodiment of the present invention;

FIG. 5 shows a cross-section of an embodiment of an individual cell of the FPD portion illustrated in FIG. 4;

FIG. 13 shows an alternative configuration to the embodiment of FIG. 4;

FIG. 14 shows a cross-section of an embodiment of an individual cell of the FPD portion illustrated in FIG. 13 formed from a Silicon-on-Glass process;

FIG. 17 shows a portion of an active matrix time-of-flight imaging device according to an exemplary embodiment of the present invention;

FIG. 18 shows a cross-section of an embodiment of an individual cell of the FPD portion illustrated in FIG. 17 formed from a Silicon-on-Glass process;

FIGS. 22 and 23 illustrate variations of the stacks of FIGS. 8 and 9;

DESCRIPTION OF THE PREFERRED EMBODIMENTS

Figure 1:
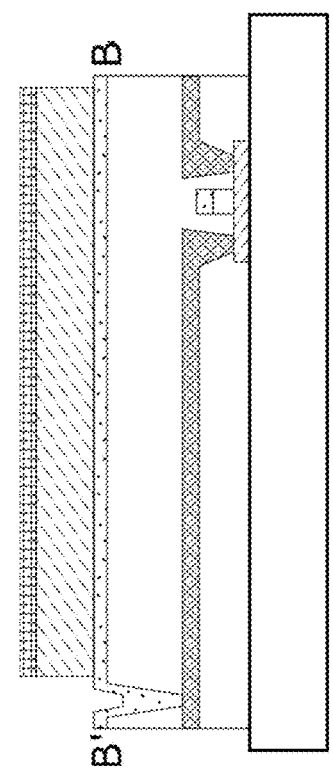
FIG. 1 shows a portion of a prior art amorphous silicon active matrix FPD.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

With reference to FIG. 4, there is disclosed an exemplary embodiment of an active matrix FPD 1 according to the present invention. The FPD 1 comprises a matrix having a plurality of N rows divided into a plurality of M columns of cells 2 (only a 3×3 portion of which are shown). The matrix is incorporated in a detector which can comprise focussing optics (not shown) which determine the field of view of the detector and which are otherwise conventional.

Each cell 2 comprises a plurality of diode segments 3 responsive to electromagnetic radiation incident on the FPD 1. In the embodiment, each cell comprises 9 diode segments laid out in a 3×3 grid. Nonetheless, it will be appreciated that this arrangement can be varied and can involve a variety of numbers of segments laid out in alternative arrangements. Nonetheless, the diode segments for embodiments of the present application can still occupy a similar area and so provide a similar resolution to the unitary diode implementations of the prior art.

Each cell 2 further comprises a transistor 10 for selectively connecting the diode segments 3 of the cell 2 to a data line 6 associated with a reader 5. Each of the diode segments 3 is connected in parallel to the transistor 10 via a respective avalanche quenching resistor 8.

For indirect X-ray detection applications, FPD 1 can comprise at least one layer of scintillation material, e.g. a phosphor, for converting incident X-ray photons to optical photons that can reach the diode segments 3 of the cells 2. In response to the incident optical photons, the diode segments 3 generate charge signals. In this way, the FPD1 can perform an indirect X-ray/charge signal conversion.

Figure 12:
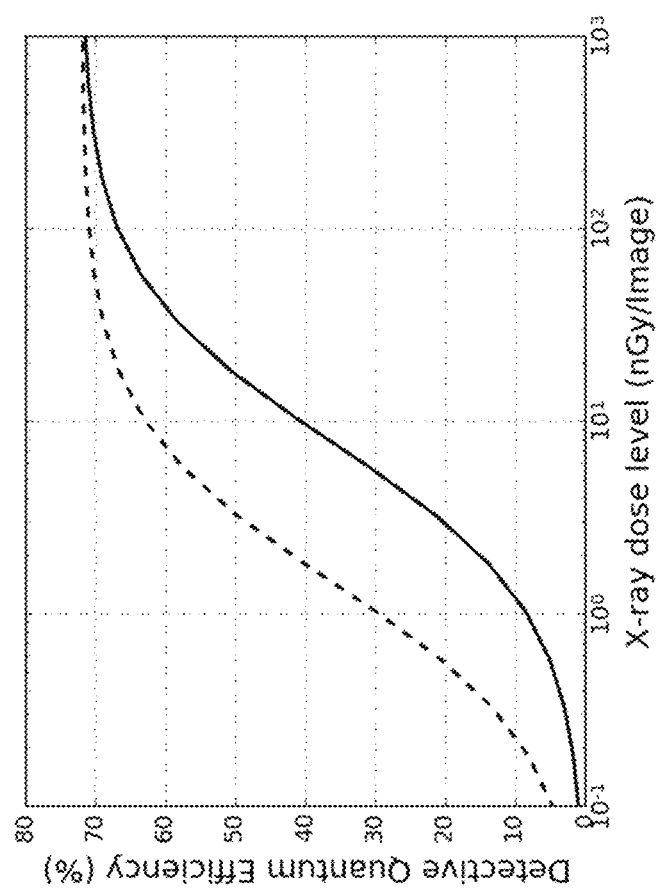
FIG. 12 shows a simulated DQE vs dose for the exemplar FPD of FIG. 1 vis-à-vis the FPD embodiment shown in FIG. 4.

The operation of the diode segments 3 is under a reverse drive voltage bias applied by power supplying means 7 to the cathodes of the diode segments 3. The reverse voltage bias is above the breakdown voltage of the diode segments 3, so that the diode segments 3 operate in an avalanche multiplication Geiger mode. In this mode, many electron-hole pairs are generated by a diode segment 3 for a single photon absorption event, resulting in a higher generated charge for a given X-ray exposure compared with the prior art solutions, as illustrated in the graph of FIG. 12.

Although not shown in FIG. 4, this charge can be stored in either a discrete capacitor provided within the cell or using parasitic capacitance.

Depending on the breakdown voltage of the diode segments 3, typical values for the reverse voltage bias can be in the range between 10 V and 30 V. The applied reverse voltage bias is a DC voltage, but can be gated by the frame time (typically 20 ms for a 50 Hz frame rate). Alternatively, the reverse voltage bias can be applied in a pulsed mode, where the pulse width is determined by the X-ray pulse width (typically about 2 ms); in this way, reliability is improved and the readout operation of the FPD 1 can occur at lower voltages than using a DC bias.

With reference to the exemplary embodiments illustrated in FIGS. 5, 10, 11 and 14, side walls 22 of the diode segments 3 within a cell 2 are laterally separated from each other by dielectric material 23, thus providing laterally confined structures to control the gain of the Geiger avalanche multiplication. A diode segment size can be between 2 μm (a limit imposed by typical photolithographic fabrication processes feature size) to 150 μm (max pixel size limit).

Each resistor 8 is designed to provide a current limiting resistance high enough to return the diode segments 3 to a pre-breakdown state after an avalanche event. The resistance value, depending on the diode segments 3 used, can be in the range between 50 kΩ and 2MΩ, and more typically between 100 kΩ and 400 kΩ.

Referring back to FIG. 4, readout of the cells 2 occurs in the same way as in the prior art example shown in FIG. 1. In particular, the FPD 1 comprises:
- a scan driver 4 for providing a plurality of N scan line signals to respective rows of the matrix, each for enabling charge values from cells 2 of a selected row to be read; and
- a reader 5 reading a plurality of M variable charge value signals from respective columns of the matrix, each corresponding to a cell 2 within a selected row.

The scan line signals from the scan driver 4 are applied to the gates 11 of the transistors 10 in the selected rows, so as to turn on these transistors 10. In this way, the diode segments 3 of the cells 2 within the selected row are operatively connected to corresponding data lines 6, and the reader 5 can sequentially read from the data lines 6, the variable charge value signals generated by the diode segments 3 of the cells 2 within the selected row. In this way, a sequential active matrix addressing of the row lines can be performed to determine the charge value, and therefore the incident radiation intensity, at each cell location of the FPD 1.

Figure 10:
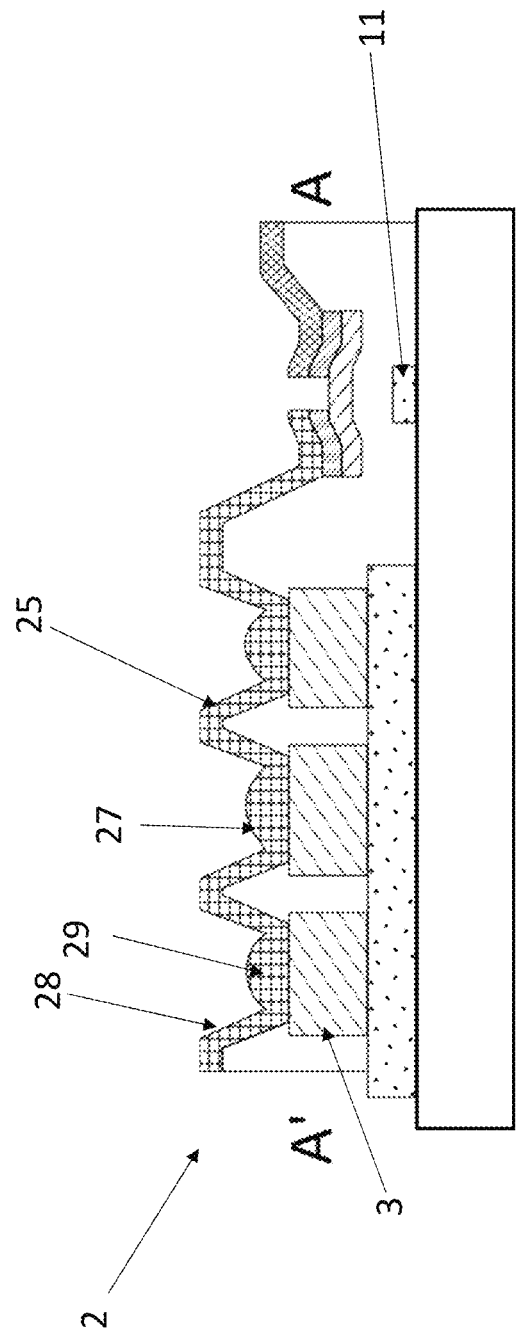
FIG. 10 shows in cross-section a variation of the cell illustrated in FIG. 5, having an optical conductive transparent layer.
Figure 11:
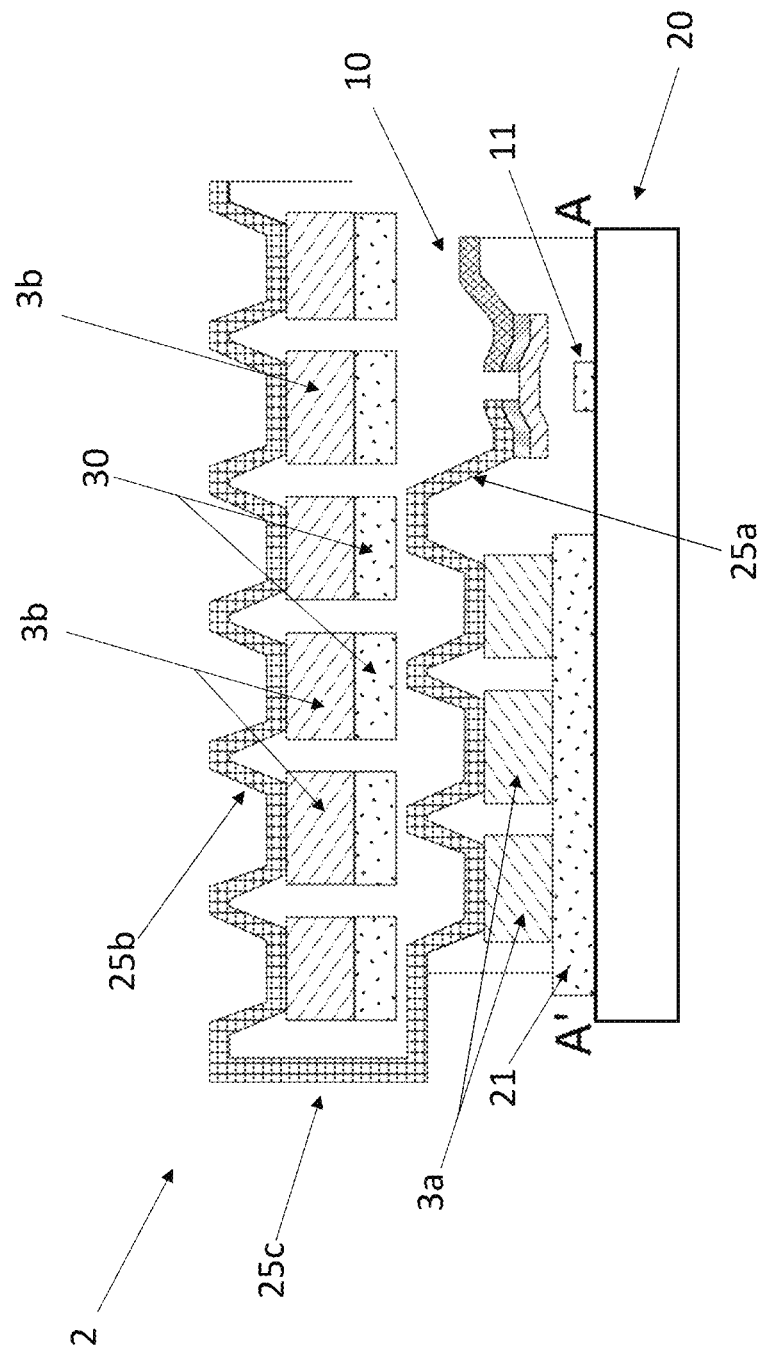
FIG. 11 shows in cross-section a still further embodiment of an individual cell of the FPD portion illustrated in FIG. 4.

In relation to fabrication, in the exemplary embodiments shown in FIGS. 5, 10 and 11, the cell 2 comprise a metal layer 11, 21 formed on a substrate 20, and the diode segments 3 of the cell 2 are formed spaced from each other on respective portions 21 of the metal layer. As mentioned above, metal portion 11 acts as a gate contact for the transistor 10. The portion of the metal layer 21 acts as a cathode for the diode segments 3 and is connected to the power supply means 7; in this way, the operating reverse bias voltage can be applied to the diode segments 3.

The cell 2 further comprises a conductive transparent layer 25, transparent to electromagnetic radiation, formed over the diode segments 3. For example, the layer 25 can be made of a conductive oxide, for example, Indium Tin Oxide (ITO).

When present in the FPD 1, the layer of scintillating material is disposed over the layer 25, so that the layer 25 allows the photons generated by the scintillating material to pass therethrough and reach the diode segments 3.

Before depositing the layer 25, a passivating dielectric material 23, for example, a silicon oxide, is deposited around the sidewalls 22 of the diode segments 3. The exposed surface of the material 23 need not be coplanar with the exposed surface of diode segments 3 and so, as shown in the embodiments, the layer 25 deposited over the diode segments 3 and dielectric material 23 need not be planar so that in this case, the layer 25 comprises, for each diode segment 3, a pad 27 lying over the upper ends of the diode segment 3 and two lateral portions 28 extending away from the pad 27 over the passivating material.

The possibility of shaping the surfaces of the diode segment and layers 3, 23 and 25 leads to opportunities such as shown in the embodiment of FIG. 10, where the pad 27 is formed with a dome-shape 29 to act as an optical lens to focus incident radiation into the centre of the corresponding underlying diode segment 3. This dome-shape can be created and controlled by depositing successive portions of the layer 25 in wells using a number of deposition steps.

In the embodiments of FIGS. 5 and 10, the layer 25 acts as an electrical connection between the anodes of the diode segments 3 of the cell 2 and the transistor 10 with the connecting track providing the resistor 8. The transistor 10 is operatively connected, through a metal layer 12, to the data-line 6 of the matrix column to which the cell 2 belongs. In this way, when a scan row signal from the scan driver 4 is applied to the gate 11 to turn on the transistor 10, the charge signal generated by the diode segments 3 can reach the data-line 6 to be read by the reader 5.

Figure 6:
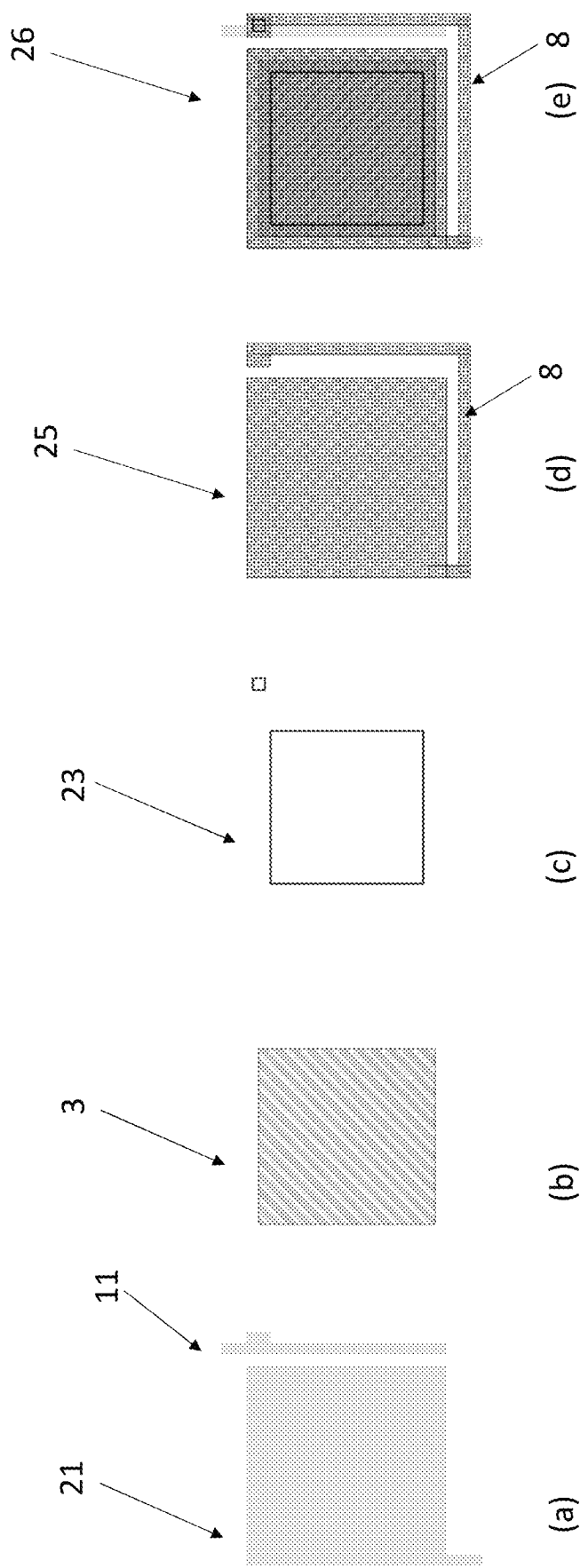
FIG. 6 shows a plan view of a single diode segment structure of the individual cell shown in FIG. 5, as well as plan side-by-side views of the layers forming this segment.

In order to better visualize the structure of the cell 2 shown in FIGS. 5 and 10, FIG. 6 shows a plan view of a single diode segment structure 26 for a cell 2, as well as a plan view of the basic layers constituting this structure 26. The metal layer comprising portions 11, 21 is first deposited, followed by the semiconductor diode layer 3. The passivation layer 23 is then deposited (in FIG. 6(c), the rectangles represent apertures in this layer through which contact with the diode layer 3 and metal contact 11 can be made). The ITO layer 25 is then deposited and FIG. 6(d) shows the track forming the resistor 8 connecting the diode segment to the transistor 10. The additional layers for fabricating the transistor 10 and contact layer 12 are not shown, but are otherwise conventional.

Figure 7:
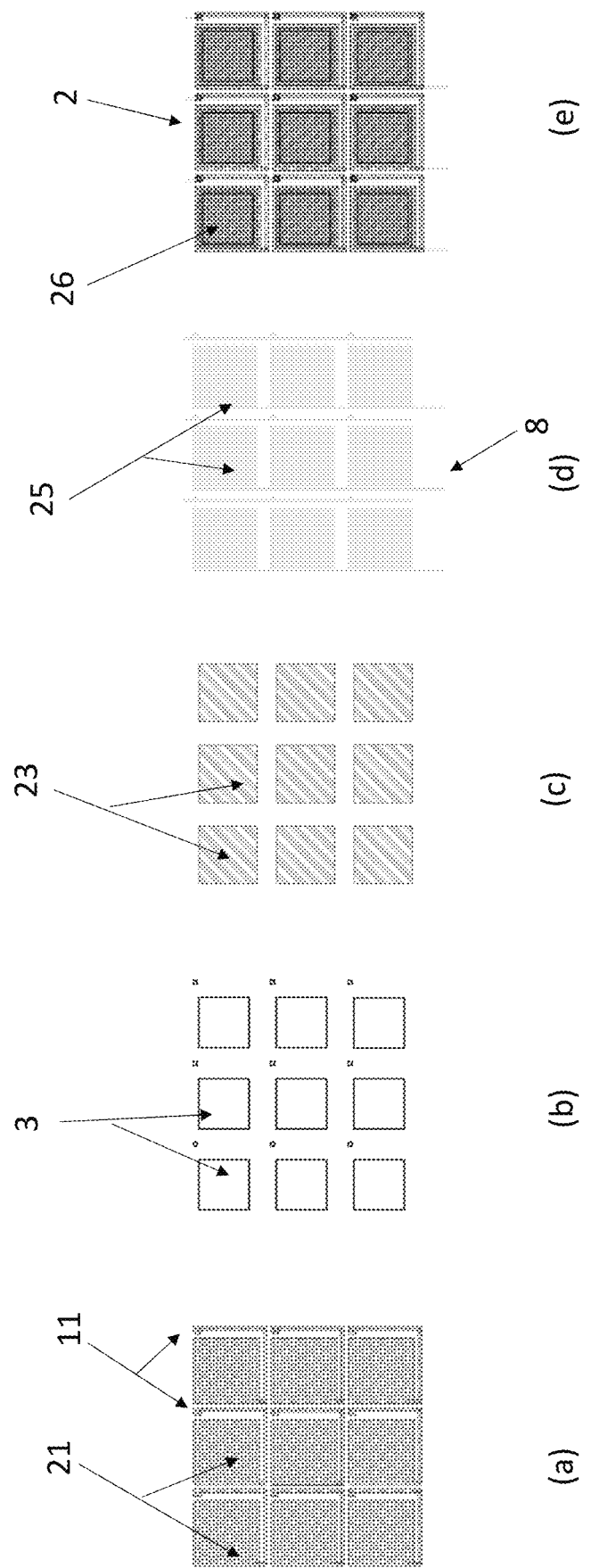
FIG. 7 shows a plan view of the individual cell shown in FIG. 5, as well as plan side-by-side views of the layers forming this cell.

FIG. 7 shows a plan view of a complete cell 2, as well as plan views of its layers 21, 11; 3; 23 and 25, wherein the diode segments 3 and their resistors 8 are connected in parallel with each other.

With reference now to FIG. 13, it is also possible to reverse the polarity of the diode segments 3' within the cells 2'. In this case, each diode anode is connected via a quenching resistor 8 to the power supply means 7, whereas each cathode is connected to a transistor 10. FIG. 14, shows such a cell 2' comprising a substrate 20, on which diode segments 3' and thin-film transistor 10 are formed using a Silicon-on-Glass process. In this case, the cell 2' comprises a first metal layer portion 31 and a second metal layer portion 32 connecting to the transistor 10. The metal layer 31 is associated with the data-line 6 of the matrix column to which the cell 2 belongs.

A first layer of dielectric material 23a fills the space between the metal layer portions 31 and 32 and the substrate 20. Dielectric 23c can be deposited at the same time as material 23a. A second layer of dielectric material 23b is disposed over the first and second metal layer portions 31, 32, and a third layer of metal material 33 is disposed over the second layer of dielectric material 23 and connected to the second metal layer portion 32.

The diode segments 3' are disposed over the third layer of metal material 33 and a conductive transparent layer 25 lies on the upper ends of the diode segments 3' and passivation material 23. Again, the layer 25 acts as a contact for the anode of the diode segments 3 back to the power supply 7; and the diode cathodes are connected to the transistor 10 via the layers 33 and 32 with the resistors 8 being defined within the layer 25.

When a scan drive signal from the scan driver 4 drives the gate 11 of the transistor 10 to turn-on, the charge signal generated by the diode segments 3' can reach, through the metal layers 33, 32, 31, the data-line 6 to be read by the reader 5.

It will be appreciated that in variants of the embodiments illustrated in FIGS. 4 and 13, the resistors 8 could be connected between the diodes 3 and the power supply 7; or between the diodes 3' and the transistors 10 respectively.

Again, when present in the FPD 1, a layer of scintillating material is disposed over the layer 25.

In the embodiment shown in FIG. 11, the cell 2 comprises, similarly to the structures shown in FIGS. 5 and 10, a lower array of spaced diode segments 3a lying on the metal layer 21, 11 over the substrate 20. The cell 2 further comprises an upper array of spaced diode segments 3b, wherein the diode segments 3a are offset relative to diode segments 3b of the upper array, in such a way as to be disposed under the spaces between diode segments 3b. An ITO layer 25a, 25b is formed over each array of diode segments 3a, 3b respectively.

The diode segments 3b lie on corresponding spaced metal portions 30, acting as cathode contacts for the diode segments 3b. The metal portions 30 are disposed in the Z-direction above but laterally offset the conductive transparent layer 25 lying on the upper ends of the diode segments 3a in the lower row. The layers 25a and 25b are connected through a via 25c so as to act as an anode connection for such diode segments 3b as well as for the segments 3a.

In this way, photons that are not absorbed by the diode segments 3b of the upper diode segments 3b are absorbed by the diode segments 3a of the lower row, thus reaching a 100% fill factor detection using a segmented diode structure.

Furthermore, as shown in FIG. 11, the detection rate can be further increased by extending the upper row of diode segments 3b so that some of its diode segments 3b are disposed over the transistor 10.

The principle illustrated in FIG. 11 is equally applicable to the Silicon-on-Glass embodiment of FIG. 14.

Figure 16:
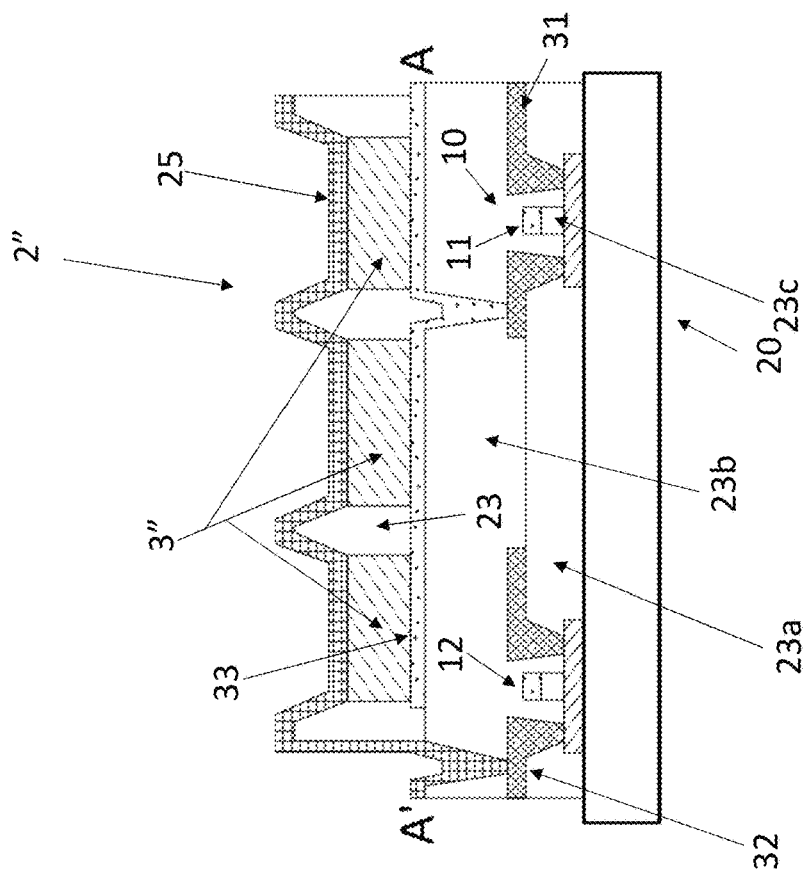
FIG. 16 shows a cross-section of an embodiment of an individual cell of the FPD portion illustrated in FIG. 15 formed from a Silicon-on-Glass process.
Figure 15:
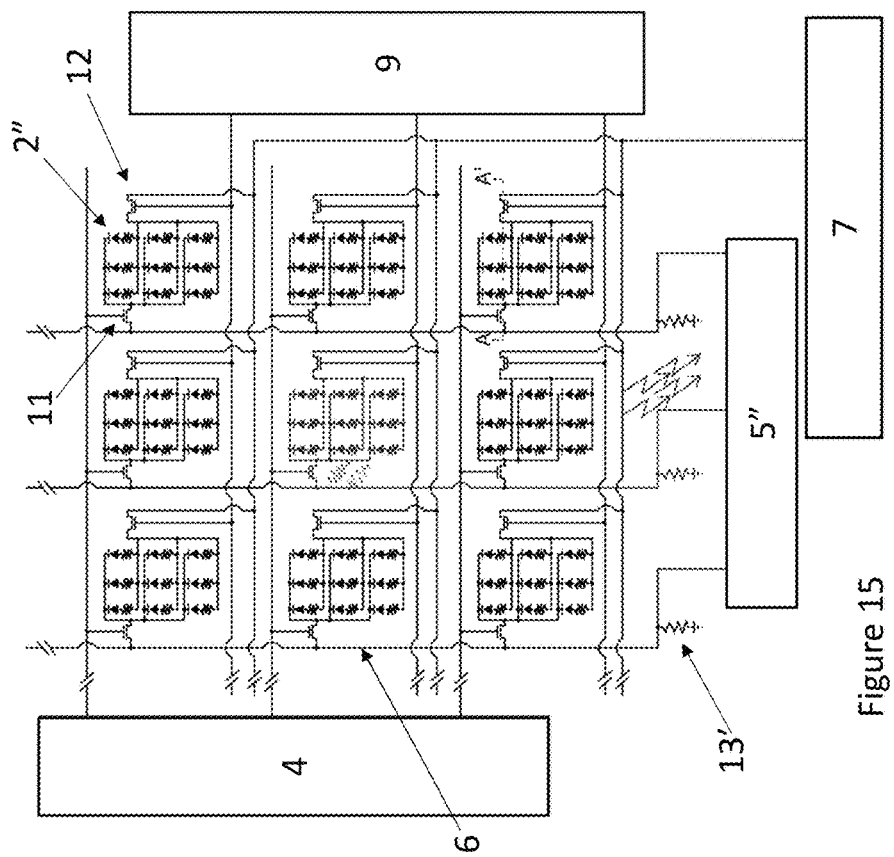
FIG. 15 shows a still further alternative configuration to the embodiment of FIG. 4.

Referring now to FIGS. 15 and 16, in a still further variation of the previous embodiments, the matrix rather than a reader 5" includes reset circuitry 9. Thus each cell includes a further transistor 12 connected between the power supply 7 and the diodes 2". The transistor gate is driven by the reset circuitry 9 to clear the charge on each diode 2" as required. As before, each diode 2" has to be initialized before any signal collection can begin. This is achieved by pulsing the reset transistor 12 to set the voltage across the diode for geiger-mode operation. Once the reset transistor 12 is off, the integration period starts. Incident light (radiation) generates electron-hole pairs that can initiate avalanche events in each diode 2", resulting in a change in the charge on the pixel. At the end of the integration period, the readout TFT (row) is selected by switching on transistor 11 and the total accumulated charge is transferred to the reader circuit 5". In the example of FIG. 15, load resistors 13' connect the data lines 6 to the reader circuit 5" rather than the charge amplifiers 13 of the embodiments of FIGS. 4 and 13, and it will be appreciated that these can be used interchangeably. FIG. 16 shows an exemplary Silicon-on-Glass implementation of this circuitry in the same fashion as the implementation of FIG. 14, with the ITO layer 25 connecting diode segments 3" to the additional transistor 12 via separate resistors (not shown).

Embodiments of the invention implemented with readout systems common to FPD imaging systems, increase the signal-to-noise of the electromagnetic radiation detection device for a given photon rate at the pixels. The resulting Detection Quantum Efficiency (DQE) of the detection device is increased for a given dose of incident electromagnetic radiation. Conversely, the dose for a given DQE value is reduced. To illustrate, a graph of the DQE vs dose for the conventional approach of FIG. 1 vis-à-vis the embodiment of FIG. 4 is shown in FIG. 12.

Figure 2:
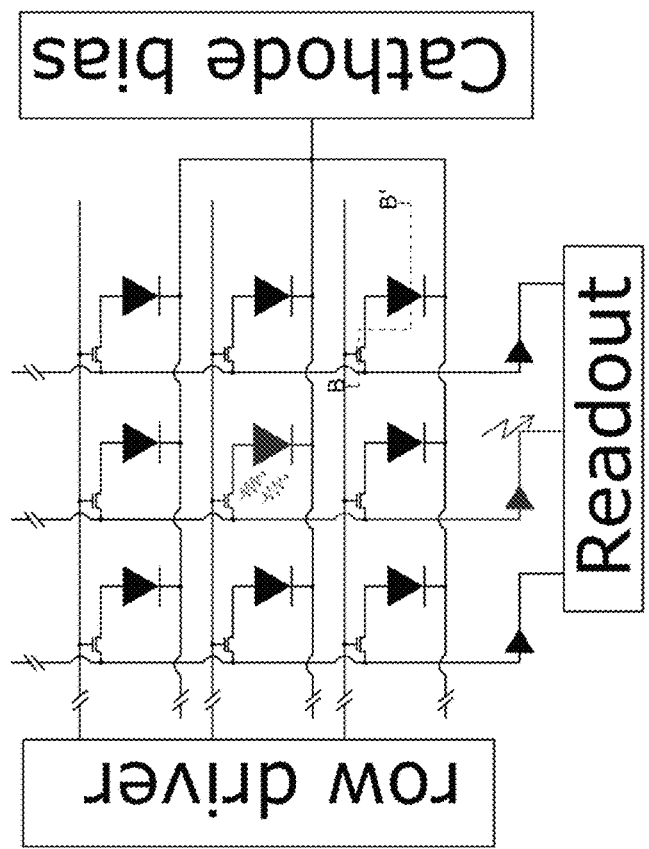
FIG. 2 shows a cross-section of a prior art first exemplar individual cell of the FPD portion illustrated in FIG. 1, wherein the anode of the diode is connected to a data-line via a thin-film transistor.
Figure 3:
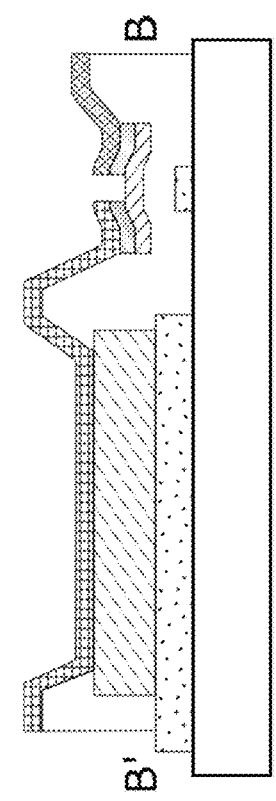
FIG. 3 shows a cross-section of a prior art second exemplar individual pixel, wherein the diode is connected to a data-line via a thin-film transistor formed from a Silicon-on-Glass process.

FIG. 12 shows how the S-shaped DQE vs X-ray dose level curve for embodiments of the invention is shifted to the left of the curve for the conventional approach of FIGS. 1, 2 and 3. This means that for X-ray images that require a DQE of 50%, the reduction in dose achieved is 82%, corresponding to a five-fold dose level reduction. While DQE is the principle figure of merit that influences the quality of the X-ray image, particularly for low exposure levels, it will be noted that other parameters, such as the Modulation Transfer Function (MTF), need not be adversely affected by this invention.

In the embodiments shown in FIGS. 5-7, 10-11 and 13-14 the avalanche quenching resistor 8 in series with the diode segments 3,3' of the cell 2,2' is patterned into the conductive transparent layer 25 used as a contact for the diode segments 3. Alternatively or in addition, an avalanche quenching resistors 8 can be:

- integrated into a diode mesa as an additional high-resistance layer; and/or
- integrated into the metal layers 21, 33 underlying the diode segments 3.

Figure 9:
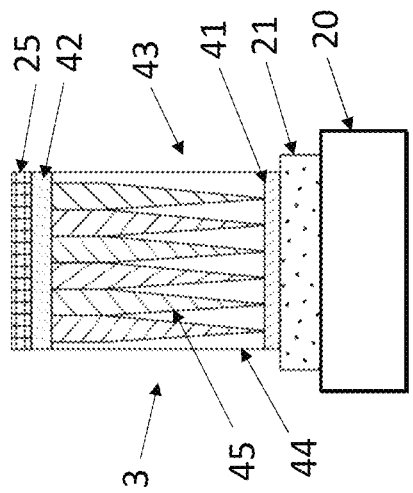
FIG. 9 shows a diode stack of a mixed-phase silicon diode usable in the FPD shown in FIG. 4.

With reference now to FIGS. 8-9, exemplary embodiments for realizing the diode segments 3 (or 3') of the FPD 1 are disclosed.

Figure 8B:
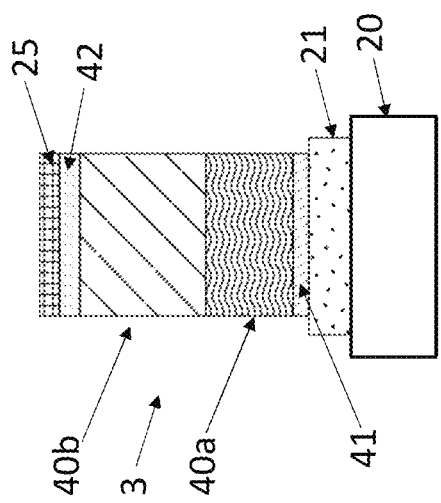
FIG. 8(b) shows an alternative to the diode stack of FIG. 8(a)
Figure 8A:
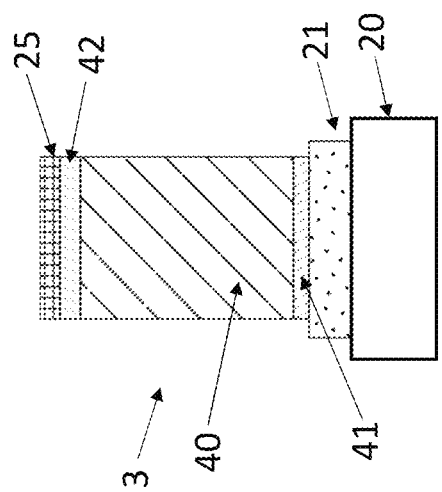
FIG. 8(a) shows a diode stack of an amorphous silicon diode usable in the FPD shown in FIG. 4.

The diode segments 3 can be realized in amorphous Silicon (a-Si) and J.-W. Hong et al, "The Hydrogenated Amorphous Silicon Reach-Through Avalanche Diodes", IEEE Journal of Quantum Electronics, IEEE, 1990 describes a process of manufacture of amorphous silicon avalanche photodiodes. FIG. 8(a) shows an exemplary a-Si diode segment 3 comprising different doped layers:

- a heavily doped n-type layer 41 on a metal layer 21 (such as the metal layer portion 21 of the cell 2 show in FIG. 5);
- a lightly doped n-type layer 40 over the layer 41; and
- a heavily doped p-type layer 42 over the layer 40 and under a conductive transparent layer 25 (such as the layer 25 of the cell 2 shown in FIG. 5).

The layers of a diode segment 3 can be doped using ion implantation, for example, patterned ion implantation to dope the diode segment 3 in a continuous layer.

In an alternative to the stack of FIG. 8(a), in FIG. 8(b), a dielectric sublayer 40a, for electron-hole pair production, is provided below a semiconductor layer 40b, for photosensitive electron-hole pair production.

In other embodiments, the diode segments 3 can comprise mixed-phase silicon. With reference to FIG. 9, such a diode segment 3 comprises:

- a heavily doped n-type layer 41 over the metal layer 21;
- a lightly doped n-type mixed-phase Silicon layer 43; and
- a heavily doped p-layer 42 over the layer 43 and under the conductive transparent layer 25.

The mixed-phase Silicon layer 43 is composed of alternate regions 44, 45 of amorphous Silicon and crystal Silicon, such as Poly-crystalline or Nano-crystalline Silicon. This mixed-phase Silicon layer 43 reduces the breakdown voltage of the diode segment 3. P. A. Beck, "High Current Density in μc-Si PECVD Diodes for Low Temperature Applications", the disclosure of which is herein enclosed by reference, discloses methods of manufacturing such μc-Si diodes.

It will be appreciated that the use of separate electron-hole production and avalanche layers as shown in the above embodiments allows the use of thin insulating avalanche layers.

Also it will be seen that the positions of the heavy doped p-type layer 42 and the heavy doped n-type layer 41 shown in FIGS. 8(*a*), 8(*b*) and 9 can be swapped.

As mentioned, in some embodiments, the FPD 1 comprises a layer of scintillating material for indirect conversion of X-rays/electrical charge. In other embodiments, the FPD 1 can be used as a direct detector, for example to detect infrared (IR) light. In this case, the scintillation material is not required and a direct conversion of IR rays/electrical charge can occur at the diode segments 3 of the matrix cells 2.

In still further variations of these embodiments, by choosing suitable materials for the diode segments 3, the FPD 1 can be used to detect X-rays directly, without scintillation material.

For example, the diode segments 3 can comprise one or more layers of non-complementary semiconductors, such as m-type layers of Gallium Indium Zinc Oxide (GIZO or IGZO).

Other diodes which are directly sensitive to X-ray radiation comprise GaAs or SiC as described for example, by R. B. Gomes et al, "GaAs/Al0.8Ga0.2As avalanche photodiodes for soft X-ray spectroscopy", Journal of Instrumentation, Volume 9, Issue 03, article id. P03014 (2014); and at http://www2.le.ac.uk/departments/physics/research/src/res/bioimaging-unit/silicon-carbide-detectors.

In still further variations, the diode segments 3 can comprise one or more layers of organic semiconductors, such as p-type layers of Pentacene.

While the above embodiments have been described in terms of an active matrix, other embodiments of the invention can also be implemented with a passive matrix circuitry, where the diode segments 3 of matrix cells 2 are connected to respective rows and columns lines of the FPD 1 without using switching devices.

It will also be seen that there need not be a one-to-one correspondence between diodes and data lines and groups of data-lines 6 can be combined to realize a segmented FPD 1.

It will be appreciated that the fabrication technology employed to produce embodiments of the present invention can be the same as is used to produce flat panel displays, for example, as disclosed in W. Boer, "Active Matrix Liquid Crystal Displays", 2005, ISBN-10: 0-7506-7813-5, the disclosure of which is incorporated herein by reference. Thus FPDs according to the invention can be integrated in flat panel matrix displays.

Thus, in virtual reality (VR) applications, such as where the image acquisition device is used to acquire images of the wearer's eyes so that their gaze can be tracked, the image acquisition device can be integrated with the VR display. Such applications can use the illumination from the VR headset display to provide, through the image acquisition device, high quality images of the wearer's eyes under low light levels and at high speeds.

It will be appreciated that applications other than VR may benefit from the improved form-factor provided by integrating this image acquisition device into a backplane for a display, such as fingerprint or gesture recognition, or display-integrated radiation monitoring.

The production of such detector can be CMOS based. Such application involves simple energy spectrum determination devices; or the detection device can be combined with Time-to-Distance convertors (TDC) for ranging applications. In such applications, the ability of the more sensitive detection device according to the present invention to capture a reflected pulse within a shorter sharper window contributes to increasing the accuracy of such ranging devices.

It will also be appreciated that in more complex implementations of the above embodiments, temperature compensation circuitry (not shown) can be incorporated into either the cells 2 or the drive circuitry 7 to ensure consistent operation of the device in different environments.

Finally, it will be seen that the principles of the above embodiments can be applied to generating time-of-flight (ToF) images with a view to generating depth maps of a scene. Referring now to FIGS. 17 and 18, the matrix is operatively coupled with a light (radiation) source (not shown) that is pulsed to illuminate a scene at a known time compared with the readout of each device row. Once initialised, a transistor 14 connected to the anode of the diode segments 3''' is open in linear mode and acts as a resistance element in parallel with a capacitor 19; the RC time of the capacitor 19 is chosen so that the charge on the pixel is time varying and discharges within a time period corresponding to the desired range of the TOF detector. For typical indoor applications a maximum range of 10 m would apply, therefore for an RC time comparable to the total round trip time of 67 ns could be chosen. When reflected photons from an illuminated scene arrive at the detector pixel, the avalanche diode segments 3''' fire, closing the transistor 14 to halt the discharging of the pixel capacitor 19 through to Vdd. The charge remaining on the pixel is then uniquely related to the time of flight of the light, and the pixel array can be read out in the conventional fashion allowing a map of distance for each location in the matrix that forms the focal plane array to be generated.

Figure 19:
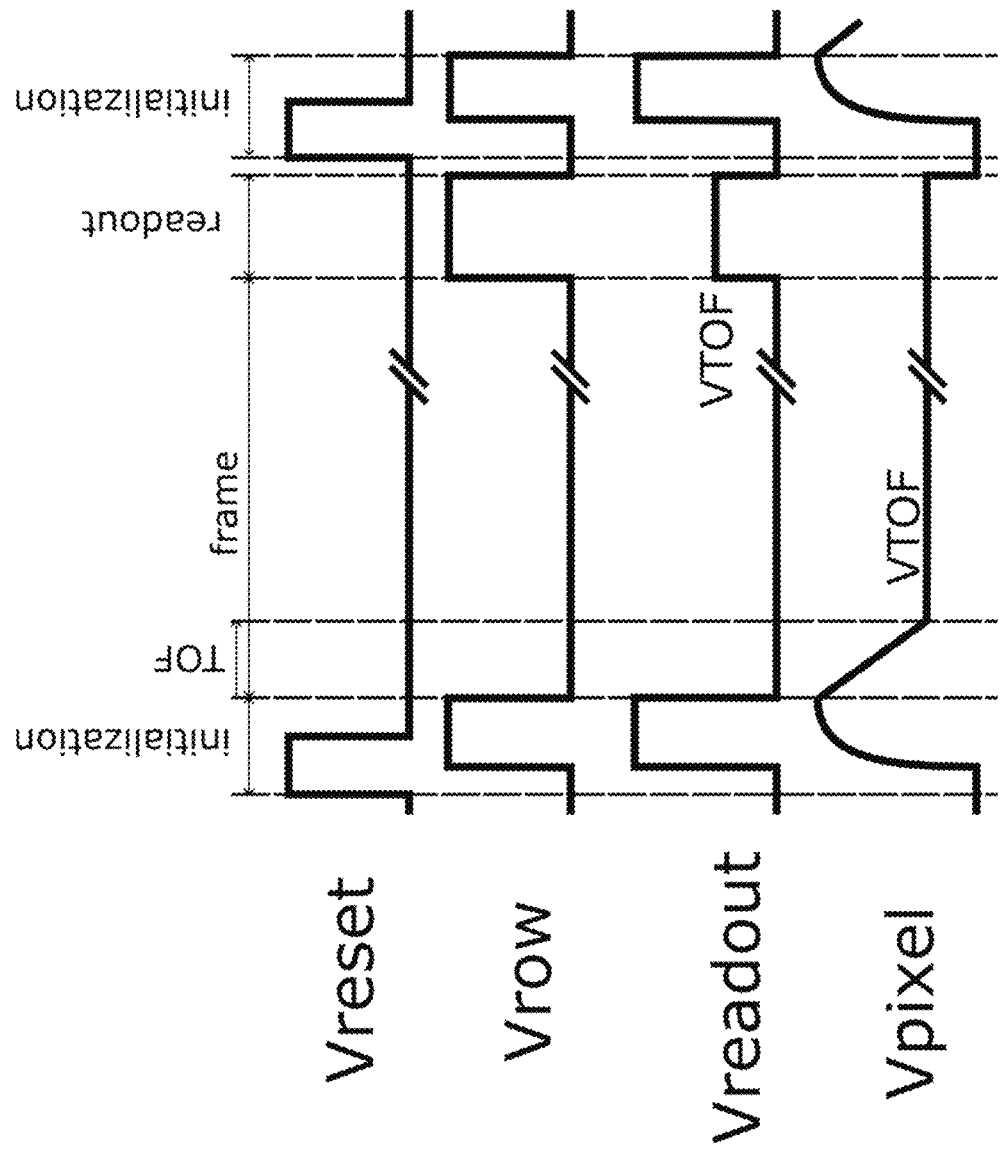
FIGS. 19 to 21 show exemplary timing diagrams for the device of FIG. 17.
Figure 20:
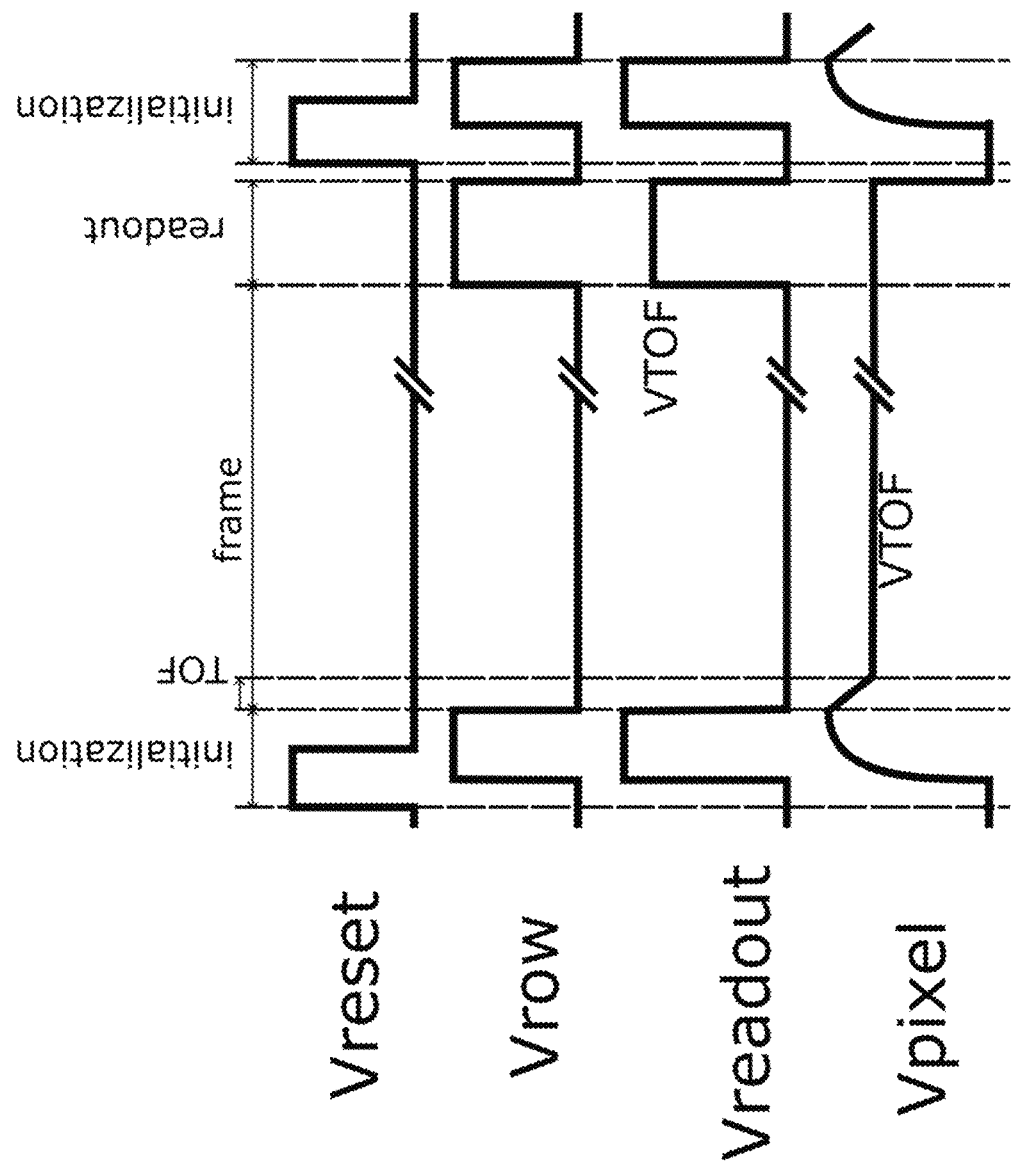
Figure 21:
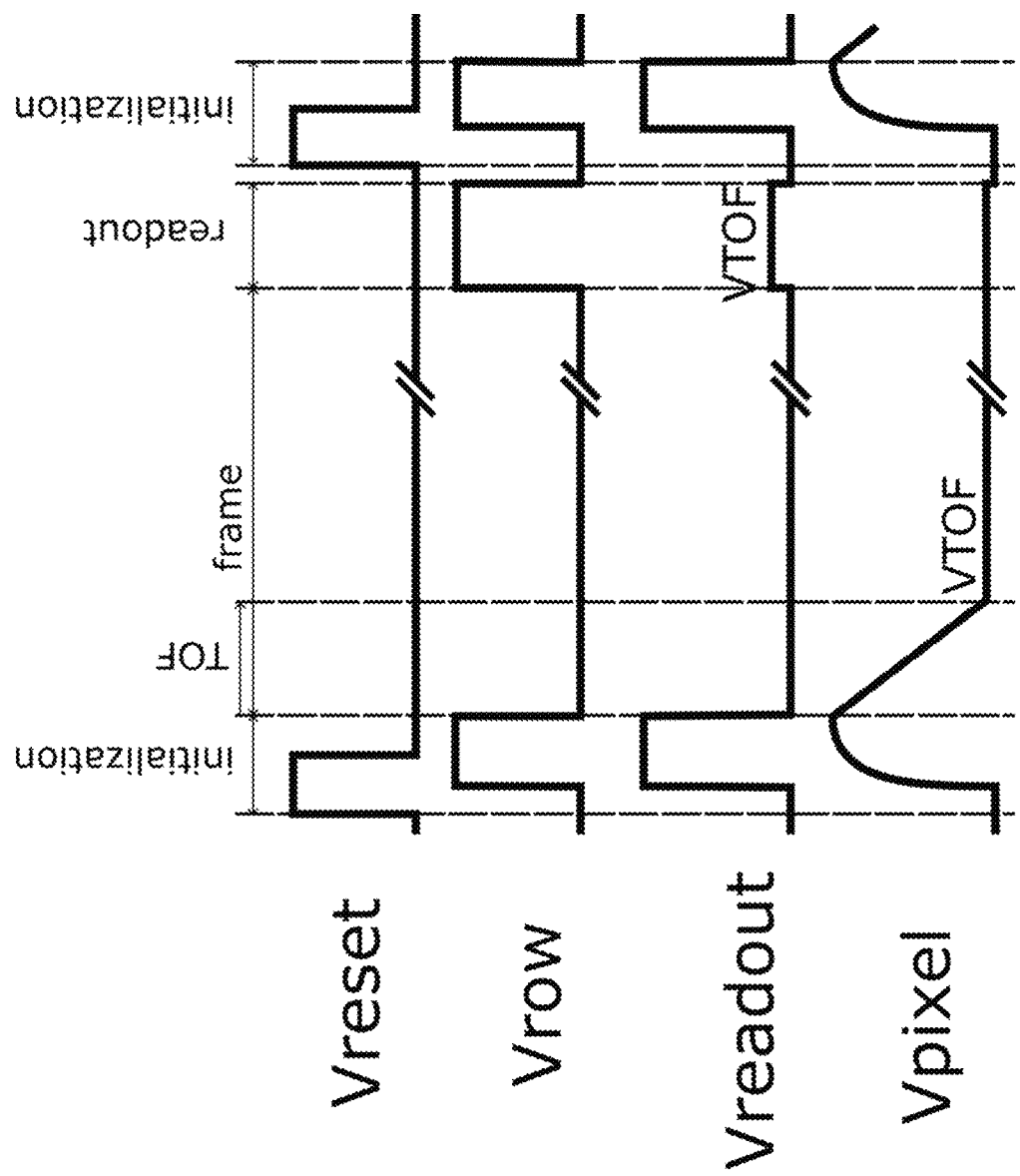

FIG. 19 is an exemplary timing diagram for the time of flight imaging circuit of FIG. 17. During initialisation, when Vreset is asserted as in the example of FIG. 15, the diode segments 3''' are reset. While Vreset is still asserted, the row driver signal (Vrow) is asserted to enable the capacitor 19 to charge to a known voltage illustrated as Vpixel. Once the row driver signal Vrow is de-asserted, the capacitor 19 begins to discharge at a known rate, until the diode segments 3''' switch on in response to a received photon. Apart from minor leakage, the charge will be maintained on the capacitor 19 until the row driver signal is then re-asserted. At that stage the analog charge value (VTOF) on the capacitor 19 can be readout while the Vrow signal is asserted. FIG. 20 shows a longer time of flight, for example, 50 ns; whereas FIG. 21 shows a shorter time of flight, for example, 10 ns.

The matrix of FIG. 17 can respond to a single pulse of radiation with each row being read sequentially. In this case, some calibration to take into account the differing leakage from row to row may be required.

Alternatively, each row of the image can be built up in response to a single pulse of radiation to avoid needing to employ such calibration.

While the above embodiment is based on measuring the extent of discharge of the capacitor 19 to determine time-of-flight, it will be appreciated that in alternative implementations of the circuit of FIG. 17, the capacitor may begin in a discharged state and time-of-flight can be determined according to its state of charge when the diode segments 3''' fire.

Referring now to FIGS. 22 and 23, there are shown still further variants of the stacks of FIGS. 8 and 9. In each of these examples, similar reference numerals are employed to indicate corresponding layers. As will be seen in FIG. 22, as well as the doped layer 42', a layer of intrinsic Silicon Carbide 42" is provided, whereas in FIG. 23, the doped layer 42 of FIG. 9 has been replaced completely with a layer of Silicon Carbide 42".

In each of the stacks of FIGS. 22 and 23, a buffer metal layer 47 comprising for example, TiN is interposed between the second layer(s) 42 and the transparent ITO layer 25. The intrinsic layer 43 can again be composed of alternate regions of amorphous semiconductor and crystalline semiconductor and as in the case of the stack of FIG. 9, it will be appreciated that such semiconductor can comprise any of Silicon, as illustrated, Silicon Germanium or Germanium.

Figure 24:
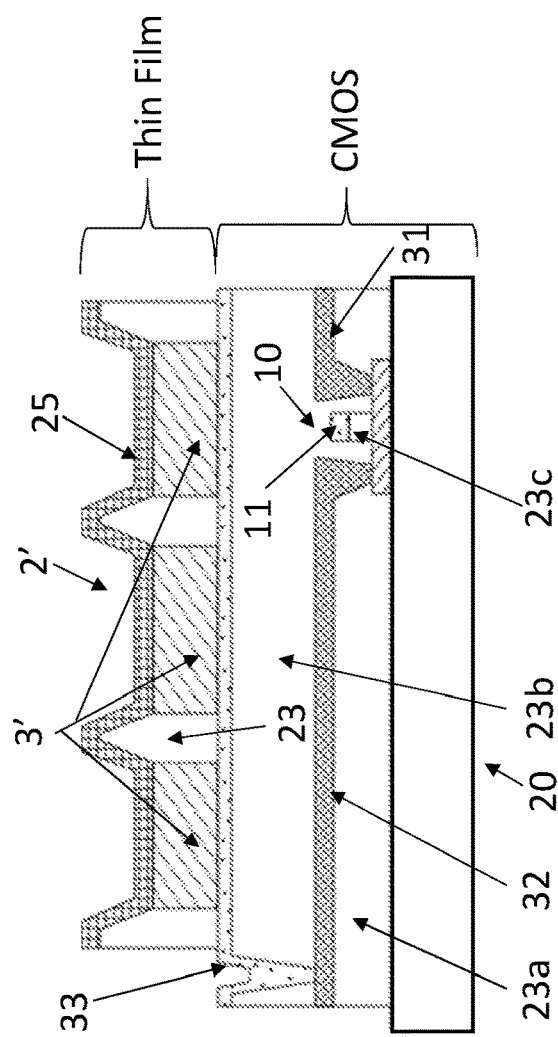
FIG. 24 illustrates a particularly advantageous manner for fabricating devices according to embodiments of the present invention.

Referring now to FIG. 24 and using as an example the structure of FIG. 14, it will be seen that one particularly advantageous approach to fabricating the devices according to the above described embodiments is to implement the logic for the matrix up to and including the uppermost metal layer 33 using a standard CMOS ROIC (read-out integrated circuit) fabrication process. Thereafter the additional layers for the detector including those for the diode segments 3' and quench resistors 8, illustrated in more detail in FIGS. 8, 9, 22 and 23, can be added by post processing the CMOS wafer using low temperature thin film deposition techniques such as PE-CVD. These techniques do not require processing temperatures in excess of approximately 400° C. and so they do not affect the integrity of the previously produced ROIC circuitry. It will be appreciated that while illustrated with the structure of FIG. 14, this technique is equally applicable to the other structures such as shown in FIGS. 5, 10, 11, 16 and 18.

In particular and to ensure the integrity of the separate diode segments 3', prior to or as part of the deposition of the dielectric layer 23 using such plasma deposition, the sidewall surfaces of the diode segments 3' can be treated using a hydrogen plasma treatment to passivate any dangling bonds of the semiconductor layer 43 with hydrogen atoms.

Figure 25:
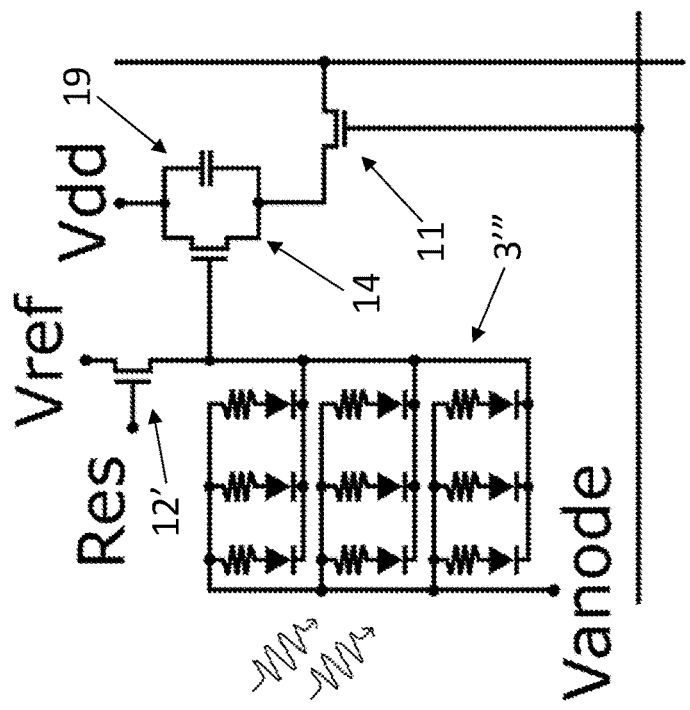
FIGS. 25-29 illustrates variations of cell design according to embodiments of the present invention.

Referring now to FIG. 25-29, there are shown variants of the cell circuits described above:

Referring first to FIG. 25, it will be appreciated that by varying Vref, Vdd, and Vanode it is possible using the same matrix topology, such as described in relation to FIGS. 17 and 18, to switch a device between a TOF mode and a simple imaging mode. When acting as an imager, the FET 14 is driven so that it is always in enhancement-mode, whereas when acting in TOF mode, the FET 14 is switched by the diode segments 3''' from enhancement-mode to depletion-mode.

Figure 26:
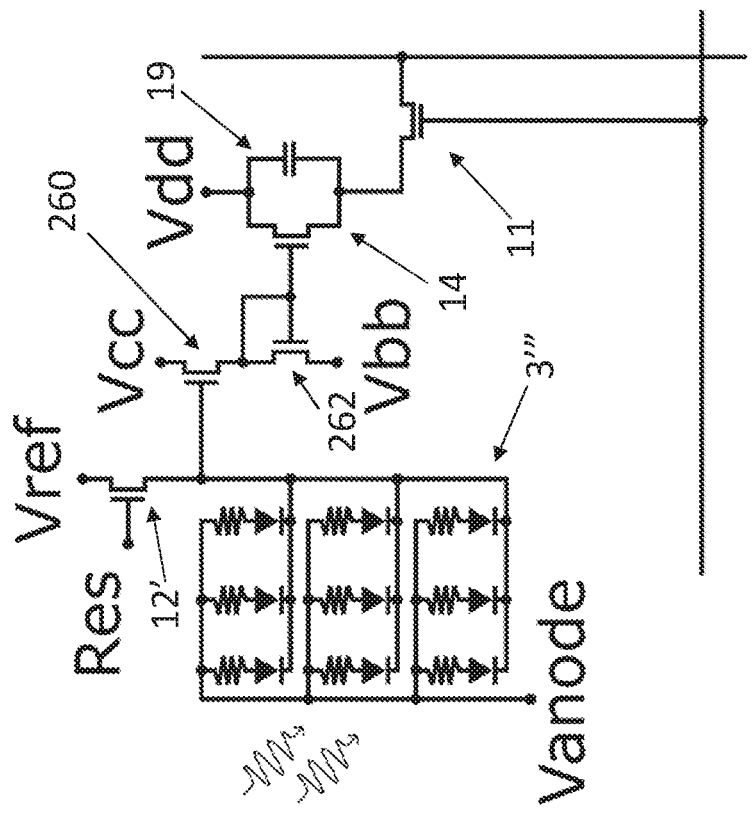

Referring to FIG. 26, in order to increase the speed of closing of a pixel and so provide more accurate time stamping, especially when operating in TOF mode, double stage amplification can be provided with the addition of a FET 260 within each cell and interposed between the diode segments 3''' and the FET 14. In order to improve temperature robustness, a further FET 262 can be added to mirror the FET 260, although it will be appreciated that this will mitigate the amplification effect provided by the FET in isolation.

Figure 27:
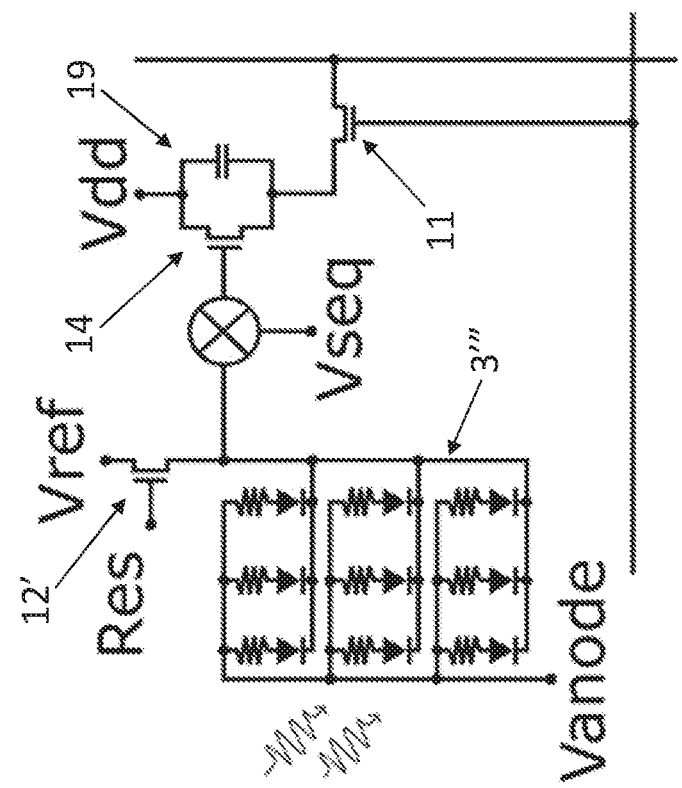

FIG. 27 shows a pixel embodiment where a Frequency-modulated continuous-wave radar (FM-CW) signal (Vseq) is interposed between the diode segments 3''' and the FET 14. Using such an approach, a transmitted signal of a known stable frequency continuous wave varies up and down in frequency over a fixed period of time by a modulating signal. Frequency differences between the reflected received signal detected by the diode segments 3''' and the transmitted signal increase with delay, and hence with distance. This technique smears out, or blurs, Doppler effect to provide improved background noise rejection.

Figure 28:
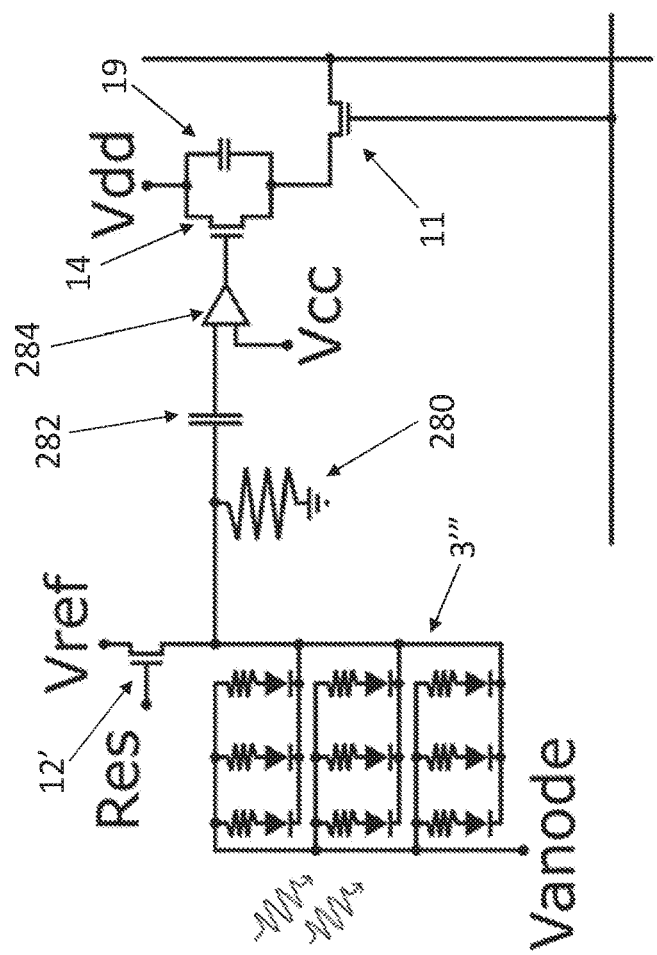

In a still further variation as shown in FIG. 28, a high pass filter comprising a shunt resistor 280 and a capacitor 282 are interposed between the diode segments 3''' and the FET 14 and rather than a gain increasing FET 260, as in FIG. 26, a comparator 284 is used. Again, this provides for faster closing of a pixel and more accurate time stamping.

Figure 29:
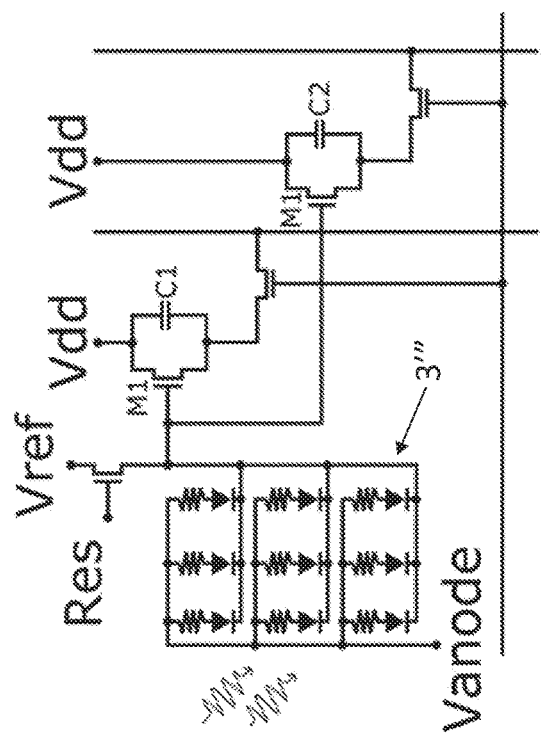

Finally, as shown in FIG. 29, in order to extend the range of the device, it can be useful to duplicate or even multiply the switch/capacitor combination 14/19 with a cascade of such elements M1/C1, M2/C2, each triggered by the diode segments 3'''. Each capacitor C1, C2 varies in size so that it charges/discharges at a different rate. Objects at short-range will trigger the smallest capacitors at the highest resolution as they charge/discharge, whereas reflections from objects at longer ranges will be picked up after the smaller capacitors have completely charged/discharged, by triggering larger capacitor elements while they are charging/discharging, but with lower resolution. Separate readout lines can be used to read values from each element C1,C2. Thus, dual mode ranging with long range/low resolution and short range/high resolution measurements can be provided from a single device.

It will be appreciated that while the features of FIGS. 25 to 29 have been described separately, these can be combined as appropriate to gain the respective functionality as required from each approach.

Finally, it will be seen that while the above described embodiments have been described in terms of cells providing an analog charge value which is read out to provide a value which is subsequently digitized, the detector design could equally be used with a read-out circuit (ROIC) comprising a cell design providing a digital output, for example, as disclosed in Perenzoni Matteo et al: "A 64×64-Pixels Digital Silicon Photomultiplier Direct TOF Sensor With 100-MPhotons/s/pixel Background Rejection and Imaging/Altimeter Mode With 0.14% Precision Up To 6 km for Spacecraft Navigation and Landing", IEEE Journal Of Solid-State Circuits, vol. 52, no. 1, page 151-160, the disclosure of which is herein incorporated by reference. Here a digital counter within each cell can be reset at the beginning of each frame and begins counting until stopped by a signal from the diode segments.

Those skilled in the art will recognize improvements and modifications to the preferred embodiments of the present disclosure. All such improvements and modifications are considered within the scope of the concepts disclosed herein and the claims that follow.

The invention claimed is:

1. An electromagnetic radiation detection device comprising:
   a matrix having a plurality of N rows divided into a plurality of M columns of cells, each cell comprising a plurality of diode segments responsive to electromagnetic radiation incident on said device;
   a scan driver providing a plurality of N scan line signals to respective rows of said matrix, each for enabling charge values generated by the plurality of diode segments in response to incident electromagnetic radiation within cells of a selected row of said matrix to be read;
   a reader reading a plurality of M variable charge value signals from respective columns of said matrix, each corresponding to a cell within a selected row of said matrix; and
   at least one conductive transparent layer over the diode segments of the cells;

wherein each diode segment is:
    connected to a drive voltage sufficient to operate each diode segment in avalanche multiplication Geiger mode; and
    connected in series with an avalanche quenching resistor to said reader.

2. The device of claim 1 further comprising at least one layer of scintillation material over the diode segments of the cells, wherein said at least one conductive transparent layer is disposed between the diode segments and the at least one layer of scintillation material.

3. The device of claim 1, wherein said at least one conductive transparent layer is shaped in such a way to converge incident electromagnetic radiation onto the diode segments of the cells.

4. The device of claim 3, wherein said at least one conductive transparent layer comprises, for each diode segment, a dome-shaped portion located over the diode segment.

5. The device of claim 1, wherein the diode segments of the cells comprise either mixed amorphous and crystalline regions of semiconducting material; or at least one of: amorphous, poly-crystalline and nano-crystalline semiconducting material.

6. The device according to claim 1, wherein the diode segments of the cells comprise at least one of: Silicon, Gallium-Indium-Zinc-Oxide, and organic semiconducting material.

7. The device according to claim 1, wherein:
    each cell comprises an electronic switching device for selectively connecting the diode segments of the cell to a data line operatively associated to the reader;
    the plurality of N scan line signals from the scan driver are suitable for turning on the switching devices of the cells of the selected row, so as to connect the diode segments of the cells of the selected row to the data line;
    for each diode segment, said at least one conductive transparent layer connects the diode segment and the electronic switching device;
    for each diode segment, said avalanche quenching resistor is connected in series to the diode segment between the drive voltage and the electronic switching device of the cell; and
    either said avalanche quenching resistor is integrated into or patterned onto a conductive transparent layer of the at least one conductive transparent layer; or is integrated into the diode segment.

8. The device of claim 1 wherein each cell further comprises a storage capacitor for storing charge generated by said diode segments.

9. The device of claim 1 wherein each diode segment is connected to said drive voltage via an electronic switching device, said electronic switching device being controlled by reset circuitry.

10. An electromagnetic radiation detection device comprising:
    a matrix having a plurality of N rows divided into a plurality of M columns of cells, each cell comprising a plurality of diode segments responsive to electromagnetic radiation incident on said device;
    a scan driver providing a plurality of N scan line signals to respective rows of said matrix, each for enabling charge values generated by the plurality of diode segments in response to incident electromagnetic radiation within cells of a selected row of said matrix to be read; and
    a reader reading a plurality of M variable charge value signals from respective columns of said matrix, each corresponding to a cell within a selected row of said matrix;
    wherein each diode segment is:
        connected to a drive voltage sufficient to operate each diode segment in avalanche multiplication Geiger mode; and
        connected in series with an avalanche quenching resistor to said reader; and
    wherein each of said diode segments comprises at least a first layer of semiconductor material for producing electrical charge in response to an incident electromagnetic radiation, and a second different layer of semiconductor material for producing a Geiger avalanche multiplication process from the electrical charge produced in the first layer.

11. An electromagnetic radiation detection device comprising:
    a matrix having a plurality of N rows divided into a plurality of M columns of cells, each cell comprising a plurality of diode segments responsive to electromagnetic radiation incident on said device;
    a scan driver providing a plurality of N scan line signals to respective rows of said matrix, each for enabling charge values generated by the plurality of diode segments in response to incident electromagnetic radiation within cells of a selected row of said matrix to be read; and
    a reader reading a plurality of M variable charge value signals from respective columns of said matrix, each corresponding to a cell within a selected row of said matrix;
    wherein each diode segment is:
        connected to a drive voltage sufficient to operate each diode segment in avalanche multiplication Geiger mode; and
        connected in series with an avalanche quenching resistor to said reader; and
    wherein said diode segments have side walls facing and separated from each other, and wherein said device comprises dielectric material covering the side walls of the diode segments.

12. An electromagnetic radiation detection device comprising:
    a matrix having a plurality of N rows divided into a plurality of M columns of cells, each cell comprising a plurality of diode segments responsive to electromagnetic radiation incident on said device;
    a scan driver providing a plurality of N scan line signals to respective rows of said matrix, each for enabling charge values generated by the plurality of diode segments in response to incident electromagnetic radiation within cells of a selected row of said matrix to be read; and
    a reader reading a plurality of M variable charge value signals from respective columns of said matrix, each corresponding to a cell within a selected row of said matrix;
    wherein each diode segment is:
        connected to a drive voltage sufficient to operate each diode segment in avalanche multiplication Geiger mode; and
        connected in series with an avalanche quenching resistor to said reader; and
    wherein said plurality of diode segments comprises at least an upper array of spaced first diode segments and a lower array of second diode segments, wherein the second diode segments are laterally offset relative to the first diode segments so as to be disposed under the spaces between the first diode segments, between said first diode segments and a substrate.

13. A time-of-flight imaging device comprising:
an electromagnetic radiation source arranged to emit at least one pulse of radiation;
a matrix having a plurality of N rows divided into a plurality of M columns of cells, each cell comprising:
  a plurality of diode segments connected to a drive voltage sufficient to operate each diode segment in avalanche multiplication Geiger mode in response to reflected electromagnetic radiation emitted by said radiation source and incident on said device from a field of view of said device; and
  a charge storage element connected to a transistor;
row driver circuitry operatively connected to each cell so as to start a charging or discharging of the charge storage element, wherein the plurality of diode segments in each cell is operatively connected to the transistor in the same cell so as to switch a transistor state in response to reflected electromagnetic radiation emitted by said radiation source incident on said diode segments and stop the charging or discharging of the charge storage element;
a scan driver providing a plurality of N scan line signals to respective rows of said matrix, each for enabling charge values from the charge storage elements of the cells of a selected row of said matrix to be read; and
a reader reading a plurality of M variable charge signals from respective columns of said matrix, each corresponding to a cell within a selected row of said matrix.

14. The device according to claim 13 wherein each cell is operably connected to reset circuitry arranged to reset each of said diode segment and said charge storage element prior to a pulse of radiation being emitted.

15. An electromagnetic radiation detection device comprising:
a readout circuit formed in a substrate using a CMOS fabrication process, the readout circuit comprising:
  a scan driver providing a plurality of scan line signals to a matrix area of said substrate to select respective rows of said matrix area, said matrix area having a plurality of N rows divided into a plurality of M columns of cells; and
  a reader reading a plurality of M charge values from respective columns of said matrix area, each corresponding to a cell within a selected row of said matrix area;
a driver for providing a drive voltage to each cell of said matrix area; and
a detector comprising a plurality of thin film layers extending over at least a portion of said matrix area of said readout circuit, at least one of said layers formed with a plasma enhanced-chemical vapor deposition (PE-CVD) process involving processing temperatures not exceeding about 400° C., the detector comprising:
  for each cell of said matrix area, a plurality of diode segments responsive to incident electromagnetic radiation on said device, each diode segment connected in series through an avalanche quenching resistor to said reader, enabling charge values generated within cells of a selected row of said matrix area to be read, each diode segment being connected to a drive voltage sufficient to operate each diode segment in avalanche multiplication Geiger mode, and each of said diode segments within a cell being separated from one another with a plasma deposited dielectric material.

16. The device according to claim 15 wherein said dielectric material is deposited after a plasma treatment of said diode segments.

17. The device according to claim 15 wherein said charge values are either analog charge values or digitally encoded charge values.

18. A time-of-flight, TOF, imaging device comprising:
an electromagnetic radiation source arranged to emit at least one pulse of radiation;
a readout circuit formed in a substrate using a CMOS fabrication process, the readout circuit comprising:
  a scan driver providing a plurality of scan line signals to a matrix area of said substrate to select respective rows of said matrix area, said matrix area having a plurality of N rows divided into a plurality of M columns of cells;
  a reader reading a plurality of M TOF values from respective columns of said matrix area, each corresponding to a cell within a selected row of said matrix area;
  for each cell, a memory element for storing said TOF value for a cell;
  a driver for providing a drive voltage to each cell of said matrix area; and
  row driver circuitry operatively connected to each cell so as to start said memory element accumulating said TOF value; and
a detector comprising a plurality of thin film layers extending over at least a portion of said matrix area of said readout circuit, at least one of said layers formed with a plasma enhanced-chemical vapor deposition (PE-CVD) process involving processing temperatures not exceeding about 400° C., the detector comprising:
  for each cell of said matrix area, a plurality of diode segments responsive to reflected electromagnetic radiation emitted by said radiation source and incident on said device from a field of view of said device, each diode segment connected in series through an avalanche quenching resistor to said memory element in the same cell so as to stop said memory element accumulating a TOF value in response to reflected electromagnetic radiation emitted by said radiation source incident on said diode segments, each diode segment being connected to a drive voltage sufficient to operate each diode segment in avalanche multiplication Geiger mode, and each of said diode segments within a cell being separated from one another with a plasma deposited dielectric material.

19. The TOF imaging device according to claim 18 wherein said memory element comprises a charge storage element and wherein said TOF value is a variable charge value.

20. The TOF imaging device according to claim 19 wherein each cell is arranged to be selectively driven in a first TOF imaging mode and a second imaging mode in which each diode segment directly generates said charge values within said cells.

21. The TOF imaging device according to claim 18 wherein said memory element comprises a digital counter and wherein each diode segment is connected to said memory element in the same cell so as to stop said counter in response to reflected electromagnetic radiation emitted by said radiation source incident on said diode segments.

22. A radiation detection device comprising a plurality of layers extending over a substrate comprising at least a portion of a matrix area of a readout circuit, at least one of said layers formed with a plasma enhanced-chemical vapor deposition (PE-CVD) process, said matrix area having a plurality of N rows divided into a plurality of M columns of cells, each cell comprising a plurality of diode segments, each connected in series through an avalanche quenching resistor, the radiation detection device comprising:
- a metal layer providing a first set of connections from said readout circuit to respective cells of said matrix area; and
- each diode segment comprising:
  - a first doped layer of a first semiconductor type formed on said metal layer;
  - a mixed phase intrinsic semiconductor layer composed of alternate regions of amorphous semiconductor and crystal semiconductor formed on said first doped layer;
  - a second layer of semiconductor material formed on said mixed phase intrinsic semiconductor layer;
  - each of said diode segments within a cell being separated from one another with a dielectric material; and
- at least one conductive transparent layer formed on said second layer and providing a second set of connections from said readout circuit to respective cells of said matrix area.

23. The device according to claim 22 wherein said second layer of semiconductor material comprises either: an oppositely doped layer to said first layer; an oppositely doped layer to said first layer and a layer of Silicon Carbide; or a layer of Silicon Carbide.

24. The device according to claim 22 wherein said mixed phase intrinsic semiconductor layer comprises either: Silicon; Silicon Germanium; or Germanium.

25. The device according to claim 22 further comprising a metal layer interposed between the at least one conductive transparent layer and the second layer.

26. The device according to claim 22 wherein said dielectric material is deposited after a plasma treatment of said diode segments.

\* \* \* \* \*